(12) United States Patent
Mori

(10) Patent No.: US 10,854,633 B2
(45) Date of Patent: Dec. 1, 2020

(54) SEMICONDUCTOR MEMORY DEVICE AND METHOD OF MANUFACTURING THE SAME

(71) Applicant: Toshiba Memory Corporation, Minato-ku (JP)

(72) Inventor: Takeo Mori, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/815,096

(22) Filed: Mar. 11, 2020

(65) Prior Publication Data

US 2020/0212067 A1    Jul. 2, 2020

Related U.S. Application Data

(63) Continuation of application No. 16/211,304, filed on Dec. 6, 2018, now Pat. No. 10,622,376, which is a continuation of application No. 15/827,028, filed on Nov. 30, 2017, now Pat. No. 10,186,522, which is a continuation of application No. 15/251,297, filed on Aug. 30, 2016, now Pat. No. 9,847,345.

(Continued)

(51) Int. Cl.
*H01L 27/11582* (2017.01)
*H01L 27/11565* (2017.01)
*H01L 27/1157* (2017.01)
*H01L 27/11568* (2017.01)
*H01L 27/11521* (2017.01)
*H01L 27/11524* (2017.01)
*H01L 27/11556* (2017.01)
*H01L 27/11529* (2017.01)

(52) U.S. Cl.
CPC .... *H01L 27/11582* (2013.01); *H01L 27/1157* (2013.01); *H01L 27/11521* (2013.01); *H01L 27/11524* (2013.01); *H01L 27/11529* (2013.01); *H01L 27/11556* (2013.01); *H01L 27/11565* (2013.01); *H01L 27/11568* (2013.01)

(58) Field of Classification Search
CPC ......... H01L 27/11556; H01L 27/11582; H01L 27/11524; H01L 27/11529; H01L 27/1157
See application file for complete search history.

(56) References Cited

U.S. PATENT DOCUMENTS 8,653,585 B2   2/2014 Youm et al.
8,921,918 B2   12/2014 Shim et al.
(Continued)

FOREIGN PATENT DOCUMENTS

JP    2012-94869    5/2012

*Primary Examiner* — Scott B Geyer
(74) *Attorney, Agent, or Firm* — Oblon, McClelland, Maier & Neustadt, L.L.P.

(57) ABSTRACT

According to an embodiment, a semiconductor memory device comprises: a stacked body that includes a plurality of control gate electrodes stacked above a substrate; a memory columnar body that extends in a first direction above the substrate and configures a memory string along with the stacked body; and a source contact that extends in the first direction and is electrically connected to one end of the memory string. Moreover, this source contact is adjacent to the stacked body via a spacer insulating layer. Furthermore, a spacer protective layer including a nitride or a metal oxide is provided between these source contact and spacer insulating layer.

25 Claims, 16 Drawing Sheets

Related U.S. Application Data

(60) Provisional application No. 62/310,226, filed on Mar. 18, 2016.

(56) References Cited

U.S. PATENT DOCUMENTS

| | | |
|---|---|---|
| 9,391,086 B1 * | 7/2016 | Soda ................. H01L 27/11582 |
| 9,478,495 B1 | 10/2016 | Pachamuthu et al. |
| 9,530,781 B2 | 12/2016 | Miyamoto et al. |
| 10,186,522 B2 | 1/2019 | Mori |
| 2011/0291172 A1 | 12/2011 | Hwang et al. |
| 2012/0132981 A1 | 5/2012 | Imamura et al. |
| 2012/0208347 A1 | 8/2012 | Hwang et al. |
| 2013/0056814 A1 * | 3/2013 | Higuchi .............. H01L 27/1157 257/314 |
| 2016/0079256 A1 * | 3/2016 | Inaba ................ H01L 27/11582 257/324 |
| 2016/0181264 A1 | 6/2016 | Miyamoto et al. |
| 2017/0018565 A1 * | 1/2017 | Nishida .............. H01L 27/1157 |

* cited by examiner

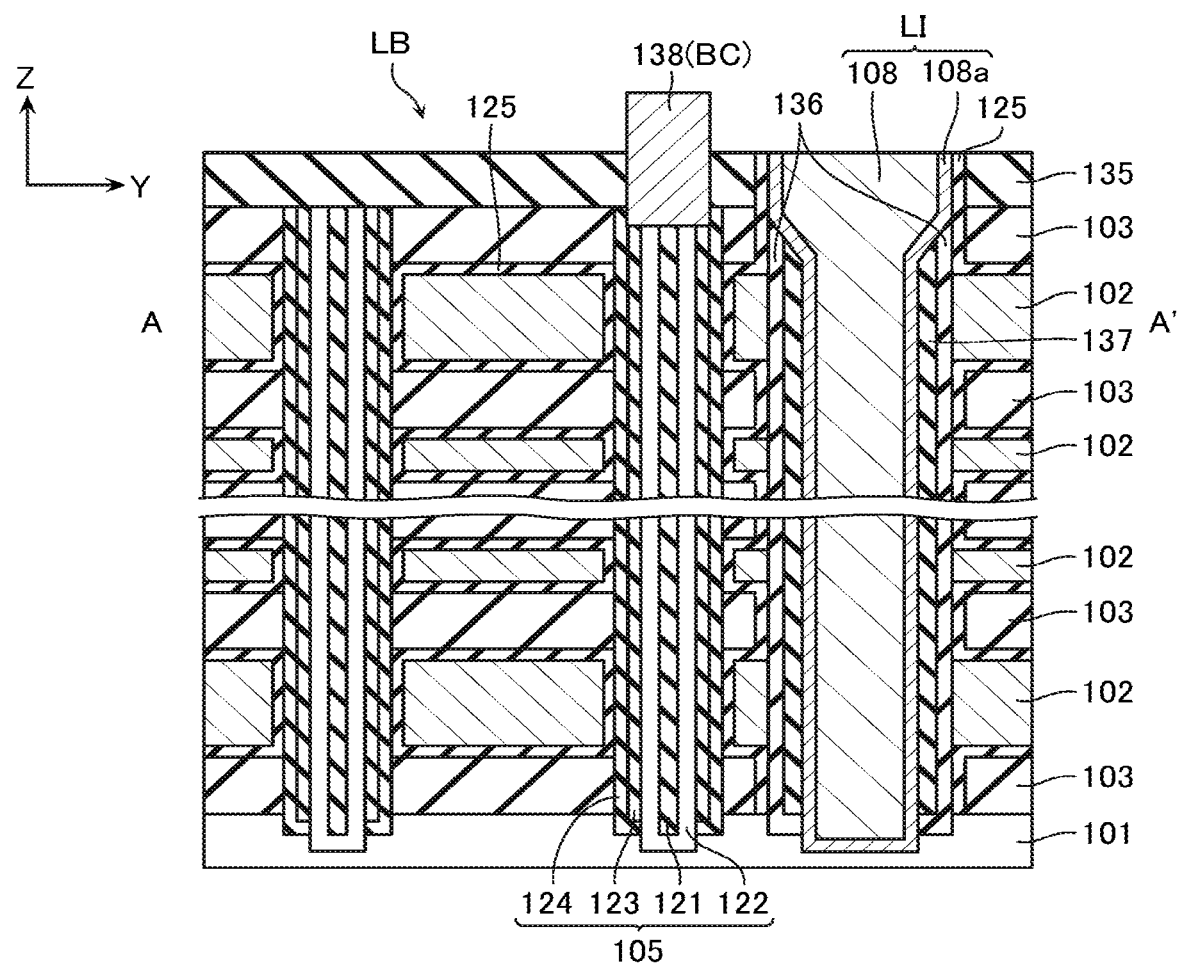

SEMICONDUCTOR MEMORY DEVICE AND METHOD OF MANUFACTURING THE SAME

CROSS-REFERENCE TO RELATED APPLICATIONS

This application is a continuation of and claims the benefit of priority under 35 U.S.C. § 120 from U.S. application Ser. No. 16/211,304 filed Dec. 6, 2018, which is a continuation of U.S. application Ser. No. 15/827,028 filed Nov. 30, 2017 (now U.S. Pat. No. 10,186,522 issued Jan. 22, 2019), which is a continuation of U.S. application Ser. No. 15/251,297 filed Aug. 30, 2016 (now U.S. Pat. No. 9,847,345 issued Dec. 19, 2017), and claims the benefit of U.S. Provisional Patent Application No. 62/310,226 filed Mar. 18, 2016, the entire contents of each of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

BRIEF DESCRIPTION OF THE DRAWINGS

FIG. 5B is a cross-sectional view showing a configuration of part of a modified example of the same nonvolatile semiconductor memory device.

DETAILED DESCRIPTION

A semiconductor memory device according to an embodiment comprises: a stacked body that includes a plurality of control gate electrodes stacked above a substrate; a memory columnar body that extends in a first direction above the substrate and configures a memory string along with the stacked body; and a source contact that extends in the first direction and is electrically connected to one end of the memory string. Moreover, this source contact is adjacent to the stacked body via a spacer insulating layer. Furthermore, a spacer protective layer including a nitride or a metal oxide is provided between these source contact and spacer insulating layer.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a structure in which a memory string extends linearly in a first direction above a substrate. However, a similar structure may be applied also to a U-shaped structure in which the memory string is doubled back on an opposite side midway. Moreover, each of the drawings of the nonvolatile semiconductor memory devices employed in the embodiments below is schematic, and thicknesses, widths, ratios, and so on, of layers are different from those of the actual nonvolatile semiconductor memory devices.

In addition, the nonvolatile semiconductor memory devices described below comprise a plurality of memory cells arranged in the above-described first direction. These plurality of memory cells are each a MONOS (Metal-Oxide-Nitride-Oxide-Semiconductor) type memory cell (memory transistor) that includes: a semiconductor layer extending in the above-described first direction and functioning as a channel body; and a control gate electrode made of a metal provided, via a charge accumulation layer, on a side surface of the semiconductor layer. However, this also is not intended to limit the present invention. For example, the above-described memory cells may each be a SONOS (Semiconductor-Oxide-Nitride-Oxide-Semiconductor) type memory cell that includes a control gate electrode made of a semiconductor, or may each be a floating gate type memory cell.

As an example of a nonvolatile semiconductor memory device having a floating gate type memory cell, refer to U.S. patent application Ser. No. 13/112,345 whose disclosure content is herewith incorporated by this reference.

First Embodiment

Semiconductor Memory Device

Figure 1:
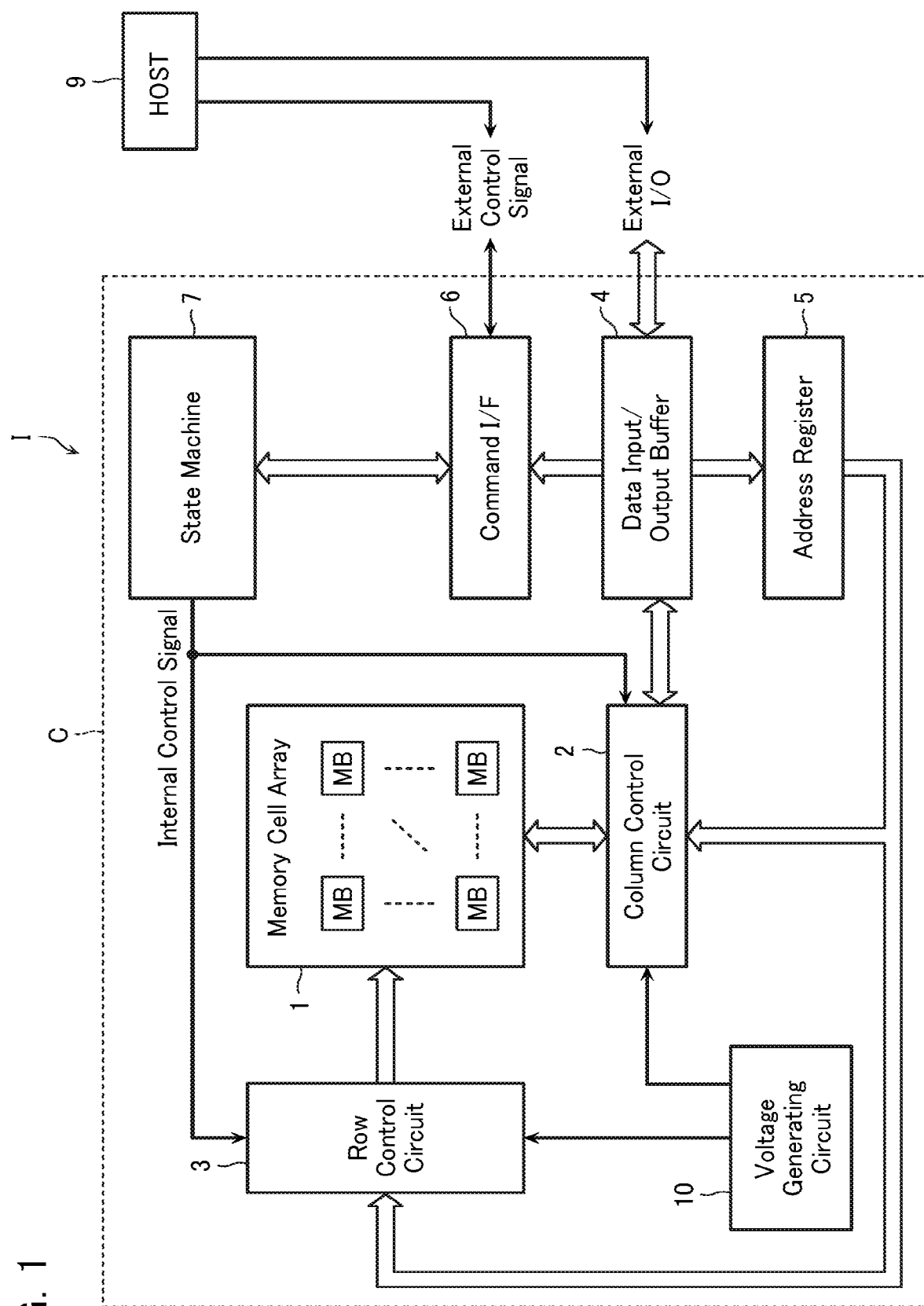
FIG. 1 is a block diagram of a nonvolatile semiconductor memory device according to a first embodiment.

FIG. 1 is a block diagram of a nonvolatile semiconductor memory device according to a first embodiment. Note that the nonvolatile semiconductor memory device referred to herein means, for example, the likes of a chip C storing user data or an electronic device I (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device I comprises the chip C and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unillustrated sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
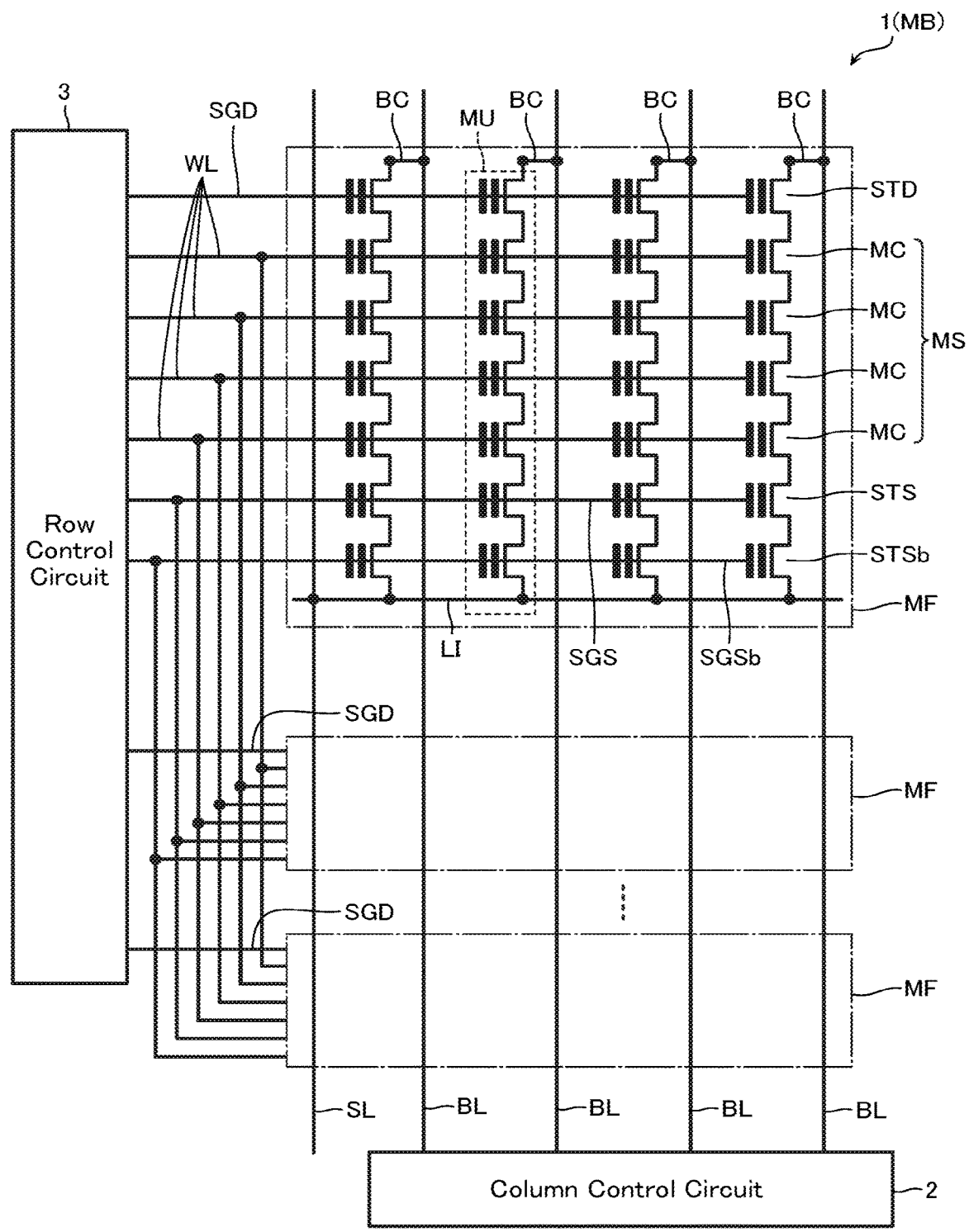
FIG. 2 is a circuit diagram showing a configuration of part of the same nonvolatile semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unillustrated source line driver via a source line SL.

The memory block MB comprises a plurality of memory fingers MF. The memory finger MF comprises a plurality of memory units MU. One ends of these plurality of memory units MU are each connected to one of the bit lines BL via a bit line contact BC. Moreover, the other ends of these plurality of memory units MU are each connected to the source line SL via a common source contact LI. The memory unit MU comprises a drain side select gate transistor STD, a memory string MS, a source side select gate transistor STS, and a lowermost layer source side select gate transistor STSb that are connected in series between the bit line contact BC and the source contact LI.

The memory string MS comprises a plurality of memory cells MC connected in series. The memory cell MC is a field effect transistor that comprises: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the control gate electrodes of the plurality of memory cells MC belonging to an identical memory string MS are respectively connected to the word lines WL. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. Connected to the plurality of drain side select gate transistors STD belonging to an identical memory finger MF is a common drain side select gate line SGD. Moreover, respectively connected to the control gate electrodes of the pluralities of source side select gate transistors STS and lowermost layer source side select gate transistors STSb belonging to an identical memory block MB are a common source side select gate line SGS and a common lowermost layer source side select gate line SGSb.

Note that in the description below, the lowermost layer source side select gate transistor STSb, the source side select gate transistor STS, and the drain side select gate transistor STD will sometimes simply be called select gate transistors (STSb, STS, and STD). Moreover, the lowermost layer source side select gate line SGSb, the source side select gate line SGS, and the drain side select gate line SGD will sometimes simply be called select gate lines (SGSb, SGS, and SGD).

Figure 3:
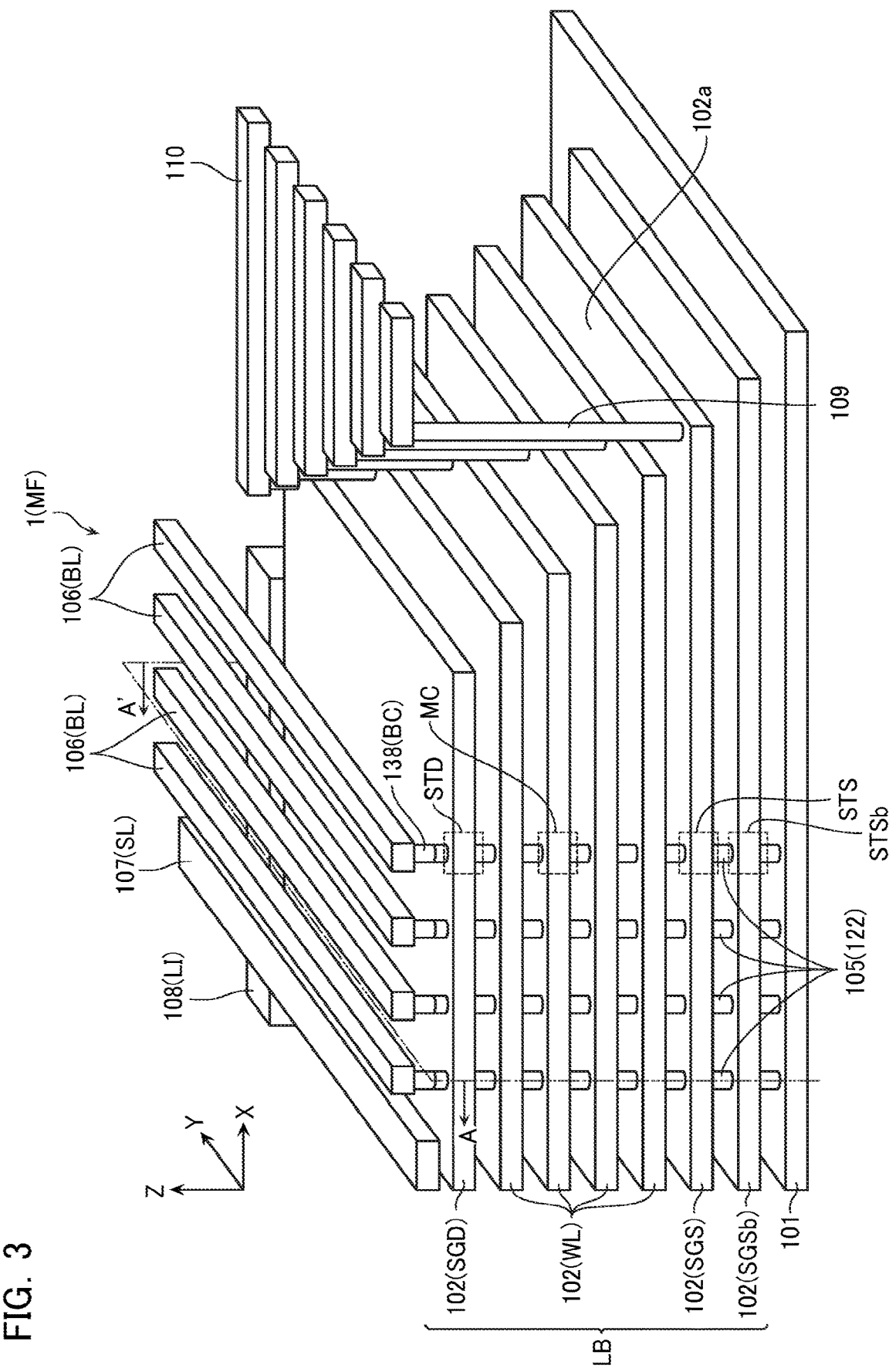
FIG. 3 is a perspective view showing a configuration of part of the same nonvolatile semiconductor memory device.

FIG. 3 is a schematic perspective view showing a configuration of part of the memory finger MF. Note that FIG. 3 explains a three-dimensional structure of a wiring line or the memory cell MC, and so on, and does not illustrate an inter-layer insulating layer provided between the wiring lines, and so on. In addition, FIG. 3 is illustrated for explanation, and a specific configuration may be appropriately changed. Moreover, in the description below, a certain direction parallel to a surface of a substrate 101 is assumed to be an X direction, a direction parallel to the surface of the substrate 101 and perpendicular to the X direction is assumed to be a Y direction, and a direction perpendicular to the surface of the substrate 101 is assumed to be a Z direction. The description below exemplifies the case where a direction in which the memory string MS extends (first direction) matches the Z direction, but the first direction need not match the Z direction. Furthermore, in the description below, a direction approaching the substrate along the first direction is assumed to be downward, and a direction going away from the substrate along the first direction is assumed to be upward.

The memory finger MF comprises: the substrate 101; a stacked body LB provided above the substrate 101; a substantially circular column-shaped memory columnar body 105 whose side surface is covered by the stacked body LB; and a conductive layer 108 (first conductive layer) adjacent from the Y direction to the stacked body LB.

The substrate 101 comprises a double well structure that includes an N type impurity layer on a surface of a semiconductor substrate and that further includes a P type impurity layer in this N type impurity layer, for example. This P type impurity layer is shown in the drawings. The substrate 101 (P type impurity layer) functions as a channel body of a transistor that has as its control gate electrode a lowermost layer conductive layer 102 in the stacked body LB and that electrically connects the memory columnar body 105 and the conductive layer 108.

The stacked body LB includes a plurality of the conductive layers 102 stacked above the substrate 101. These conductive layers 102 respectively function as the word line WL and control gate electrode of the memory cell MC, or as the select gate lines (SGSb, SGS, and SGD) and control gate electrodes of the select gate transistors (STSb, STS, and STD). The conductive layer 102 is configured from a conductive layer of the likes of tungsten (W), for example. In addition, each of the conductive layers 102 comprises a contact part 102a projecting in the X direction with respect to the conductive layer 102 positioned in a layer above it, and is connected to the row control circuit 3 (FIGS. 1 and 2)

via a via contact wiring line 109 connected to a surface of this contact part 102a and via a wiring line 110. Note that the via contact wiring line 109 and the wiring line 110 are configured from a conductive layer of the likes of tungsten (W).

The memory columnar body 105, along with the stacked body LB, configures the memory string MS, and so on. That is, an intersection of the conductive layer 102 and the memory columnar body 105 functions as the memory cell MC or the select gate transistor (STSb, STS, or STD). The memory columnar body 105 includes a substantially circular column-shaped semiconductor layer 122 extending in the Z direction. The semiconductor layer 122 faces the plurality of conductive layers 102 and functions as channel bodies of the memory cells MC and the select gate transistors (STSb, STS, and STD). A lower end of the semiconductor layer 122 is connected to the unillustrated source line driver, via the substrate 101, the conductive layer 108, and a conductive layer 107 which is provided above the conductive layer 108 and functions as the source line SL. An upper end of the semiconductor layer 122 is connected to the column control circuit 2 (FIGS. 1 and 2) via a conductive layer 138 which functions as the bit line contact BC and a conductive layer 106 which functions as the bit line BL. Note that the conductive layer 106, the conductive layer 107, and the conductive layer 138 are configured from a conductive layer of the likes of tungsten (W). Moreover, the conductive layer 106 and the conductive layer 107 are arranged in plurality in the X direction and extend in the Y direction.

The conductive layer 108 functions as the source contact LI. The conductive layer 108 comprises a substantially plate-like shape extending in the X direction and the Z direction along a side surface of the stacked body LB. The conductive layer 108 is configured from a conductive layer of the likes of tungsten (W). The conductive layer 108 is connected at its lower end to the substrate 101. Therefore, when a channel (inversion layer) is formed in a vicinity of a substrate 101 surface, a lower end of the source contact LI and the lower end of the semiconductor layer 122 (one end of the memory string MS) are electrically connected.

Figure 4:
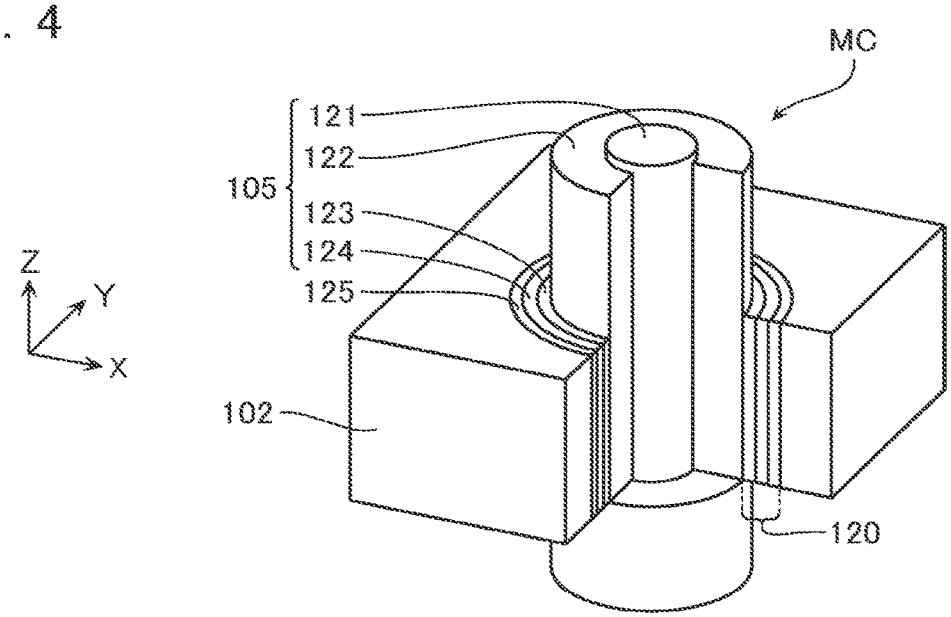
FIG. 4 is a perspective view showing a configuration of part of the same nonvolatile semiconductor memory device.

FIG. 4 is a schematic perspective view showing a configuration of the memory cell MC. Note that FIG. 4 shows the configuration of the memory cell MC, but the select gate transistors (STSb, STS, and STD) may also be configured similarly to the memory cell MC. Note that in FIG. 4, part of the configuration is omitted.

The memory cell MC is provided at an intersection of the conductive layer 102 and the memory columnar body 105. The memory columnar body 105 comprises: a circular column-shaped core insulating layer 121 extending in the Z direction; the semiconductor layer 122 covering a side surface of the core insulating layer 121; a tunnel insulating layer 123 covering a side surface of the semiconductor layer 122; and a charge accumulation layer 124 covering a side surface of the tunnel insulating layer 123. In addition, a block insulating layer 125 is provided between the charge accumulation layer 124 and the conductive layer 102. The semiconductor layer 122, the tunnel insulating layer 123, and the charge accumulation layer 124 are formed in a substantially cylindrical shape extending in the Z direction along a side surface of the core insulating layer 121.

The core insulating layer 121 is configured from an insulating layer of the likes of silicon oxide ($SiO_2$), for example. The semiconductor layer 122 is configured from a semiconductor layer of the likes of polysilicon, for example. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example. The block insulating layer 125 is configured from an insulating layer of, for example, silicon oxide ($SiO_2$) or silicon nitride ($Si_3N_4$), alumina ($AlO_3$), or the like. The tunnel insulating layer 123, the charge accumulation layer 124, and the block insulating layer 125 are provided between the conductive layer 102 and the semiconductor layer 122, and configure a gate insulating layer 120 capable of accumulating a charge.

Figure 5A:
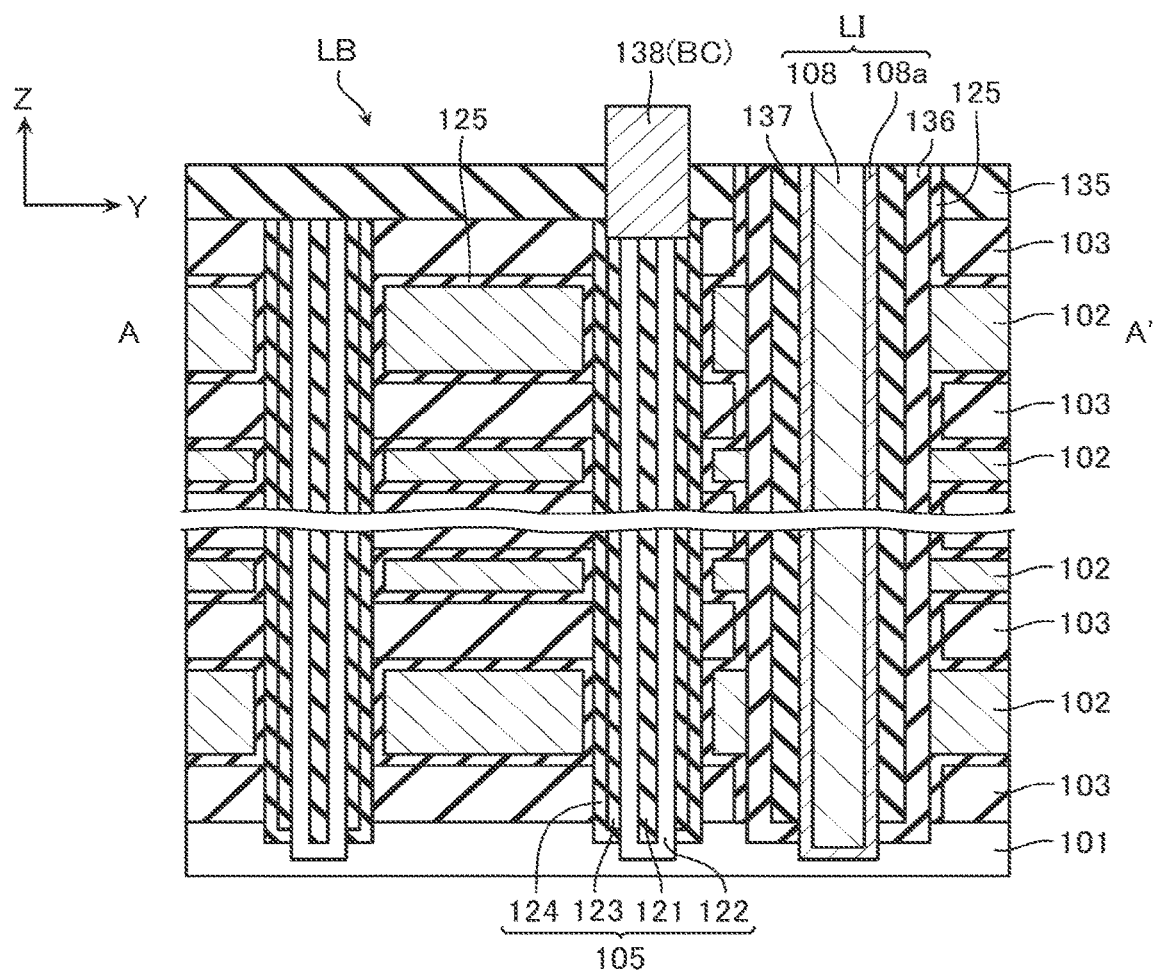
FIG. 5A is a cross-sectional view showing a configuration of part of the same nonvolatile semiconductor memory device.

FIG. 5A is a cross-sectional view of the configuration shown in FIG. 3 cut by a plane including the two dot-chain line in FIG. 3 and viewed along a direction of the arrows A and A'. A and A' in FIG. 5A respectively indicate positions where the arrows A and A' in FIG. 3 are provided. Moreover, FIG. 5A illustrates the likes of inter-layer insulating layers 103 and 135 that were omitted in FIG. 3. Moreover, FIG. 5A omits illustration of the conductive layer 106. Moreover, FIG. 5A illustrates the two memory columnar bodies 105 most closely adjacent to the source contact LI. Note that FIG. 5A is illustrated for explanation, and a specific configuration may be appropriately changed.

The source contact LI includes: the conductive layer 108 (first conductive layer) extending in the Z direction; and a barrier metal layer 108a covering a lower surface and side surface of this conductive layer 108. The barrier metal layer 108a is configured from a conductive layer of the likes of titanium (Ti) or titanium nitride (TiN), for example, and suppresses diffusion of an impurity, and so on, when forming the conductive layer 108. Note that a silicide and an N type impurity layer may be provided between the source contact LI and the substrate 101 (P type impurity layer).

A spacer insulating layer 136 is provided between the source contact LI and the stacked body LB. The spacer insulating layer 136 covers a side surface of the source contact LI, and the source contact LI is adjacent to the stacked body LB via this spacer insulating layer 136. The spacer insulating layer 136 secures insulation between the conductive layer 102 and the source contact LI. The spacer insulating layer 136 is configured from an insulating layer of the likes of silicon oxide ($SiO_2$).

Now, in the present embodiment, a spacer protective layer 137 is provided between the source contact LI and the spacer insulating layer 136. The spacer protective layer 137 covers side surfaces of the source contact LI and the spacer insulating layer 136. The conductive layer 108 contacts the spacer protective layer 137 via the barrier metal layer 108a. Moreover, the spacer protective layer 137 is formed from a material having a lower etching rate (a material having a higher etching resistance) than the spacer insulating layer 136. For example, if the spacer insulating layer 136 is of silicon oxide ($SiO_2$), then the likes of a nitride film or a metal oxide film may be employed as the spacer protective layer 137. More specifically, the likes of a silicon nitride ($Si_3N_4$) film or an alumina ($Al_2O_3$) film may be employed as the spacer protective layer 137.

Moreover, in the present embodiment, the stacked body LB comprises: a plurality of the conductive layers 102 and the inter-layer insulating layers 103 (first inter-layer insulating layers) stacked alternately in the Z direction; and the inter-layer insulating layer 135 (second inter-layer insulating layer) provided above the plurality of conductive layers 102 and inter-layer insulating layers 103 and the memory columnar body 105. Moreover, the block insulating layer 125 is provided between the inter-layer insulating layers 103 and the source contact LI, and between the inter-layer insulating layer 135 and the source contact LI. The block insulating layer 125 is formed from a material having a lower etching rate (a material having a higher etching resistance) than the spacer insulating layer 136. For example, if the spacer insulating layer 136 is of silicon oxide ($SiO_2$), then the likes of a nitride film or a metal oxide film may be employed as the block insulating layer 125. More specifically, the likes of a silicon nitride ($Si_3N_4$) film or an alumina ($Al_2O_3$) film may be employed as the block insulating layer 125.

Figure 6:
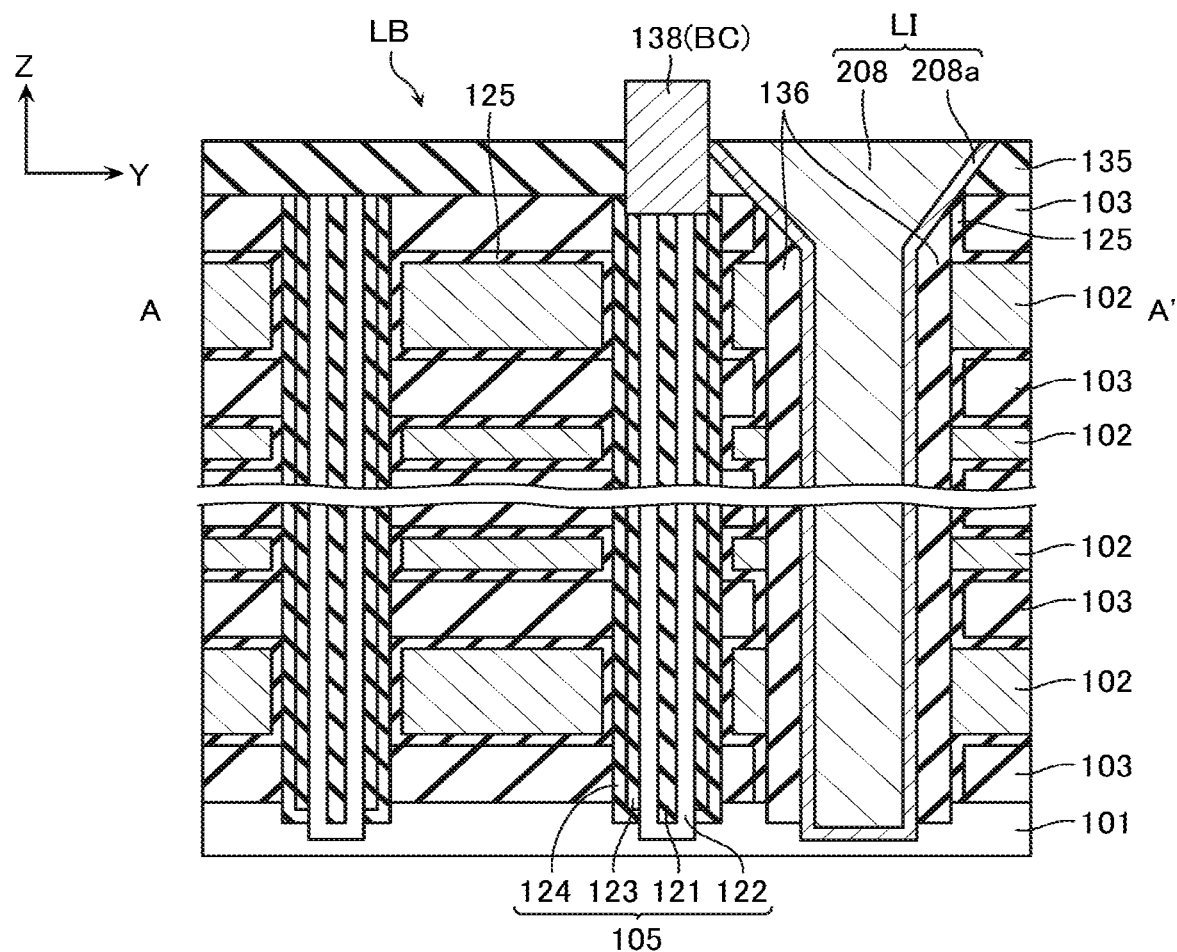
FIG. 6 is a cross-sectional view showing a configuration of part of a nonvolatile semiconductor memory device according to a comparative example.

Now, during manufacturing of a nonvolatile semiconductor memory device comprising such a configuration, for example, the stacked body LB and the memory columnar body 105 are formed on the substrate 101, a trench is provided at a position corresponding to the source contact LI, and so on, and the spacer insulating layer 136 is formed on a side part and bottom part of this trench. Then, after the spacer insulating layer 136 has been provided and before the source contact LI is formed, the spacer insulating layer 136 in a trench bottom part is processed by anisotropic etching such as RIE (Reactive Ion Etching) in order to form a contact to the substrate 101. However, in this step, as shown in FIG. 6, for example, sometimes, not only the spacer insulating layer 136 in the trench bottom part, but also parts of the spacer insulating layer 136, inter-layer insulating layer 135 and so on, close to an opening of the trench are removed, and a width of an upper surface of the source contact LI ends up broadening. As a result, there is a possibility of the following malfunction occurring, namely, that the source contact LI ends up contacting the likes of the conductive layer 138 functioning as the bit line contact BC, resulting in a defective product.

Accordingly, as shown in FIG. 5A, in the present embodiment, the spacer protective layer 137 that protects the spacer insulating layer 136 is provided between the source contact LI and the spacer insulating layer 136. As a result, when the spacer insulating layer 136 in the trench bottom part is removed by anisotropic etching such as RIE, the spacer protective layer 137 acts as a mask, hence etching in a transverse direction close to the opening of the trench does not proceed. Therefore, it can be suppressed that parts of the spacer insulating layer 136 or inter-layer insulating layer 135 are removed and that the width of the upper surface of the source contact LI thereby broadens. Therefore, it becomes possible to configure such that the source contact LI and the bit line contact BC do not come into contact.

Moreover, in the present embodiment, the conductive layer 108 contacts the spacer protective layer 137 via the barrier metal layer 108a. In such a configuration, a layer other than the barrier metal layer 108a is not provided between the conductive layer 108 and the spacer protective layer 137, hence the width of the upper surface of the source contact LI can be kept to a minimum.

Moreover, in the present embodiment, the block insulating layer 125 is provided between the inter-layer insulating layer 135 and the source contact LI. Therefore, when, for example, the block insulating layer 125 is formed from a material having a lower etching rate (a material having a higher etching resistance) than the spacer insulating layer 136, such as alumina ($Al_2O_3$), then, as shown in FIG. 5B, even if the spacer protective layer 137 and spacer insulating layer 136 are thinned and parts of these films are removed, removal of part of the inter-layer insulating layer 135 can be suppressed by this block insulating layer 125 ultimately. In such a way, occurrence of the above-described malfunction may be suppressed by a combination of materials of the spacer insulating layer 136, the spacer protective layer 137, and the block insulating layer 125.

Method of Manufacturing

Figure 7:
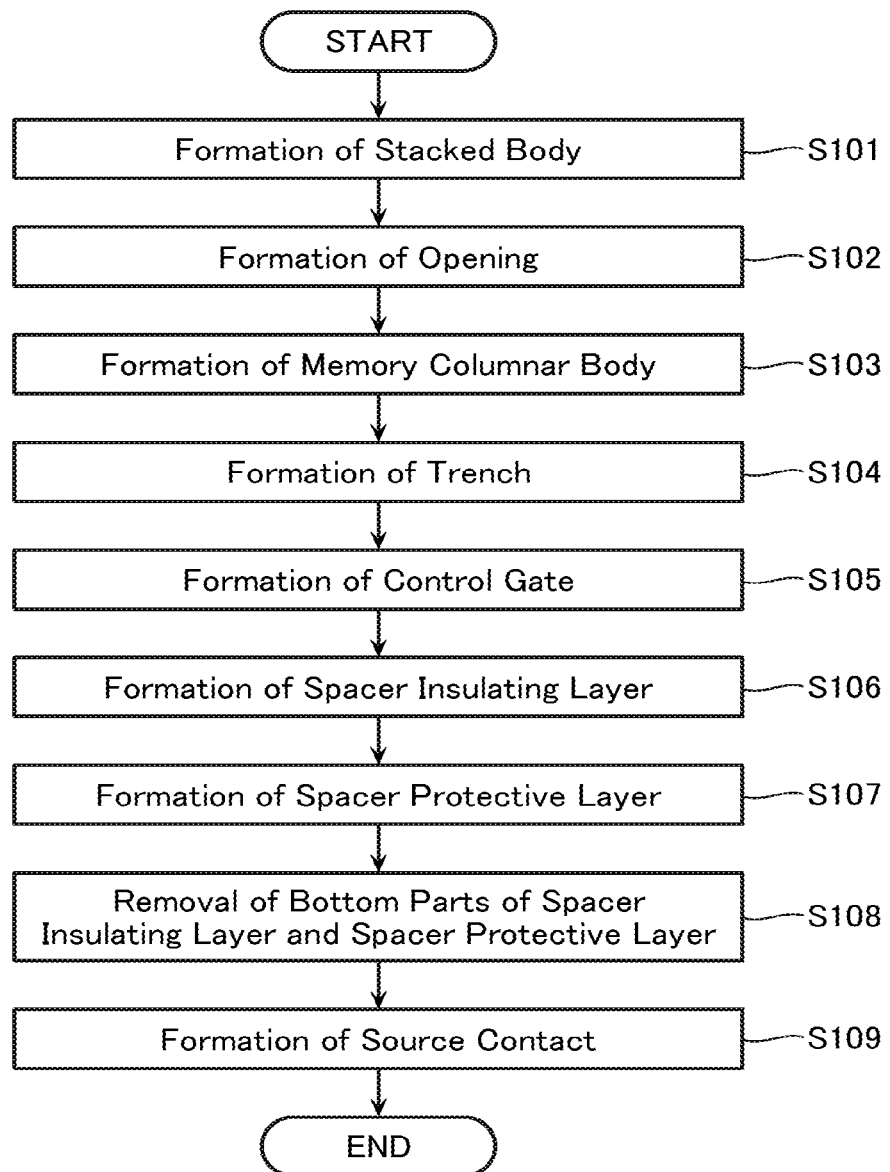
FIG. 7 is a flowchart for explaining a method of manufacturing the nonvolatile semiconductor memory device according to the first embodiment.

FIG. 7 is a flowchart for explaining a method of manufacturing a nonvolatile semiconductor memory device according to the first embodiment. FIGS. 8 to 18 are cross-sectional views for explaining the same method of manufacturing a nonvolatile semiconductor memory device.

Figure 8:
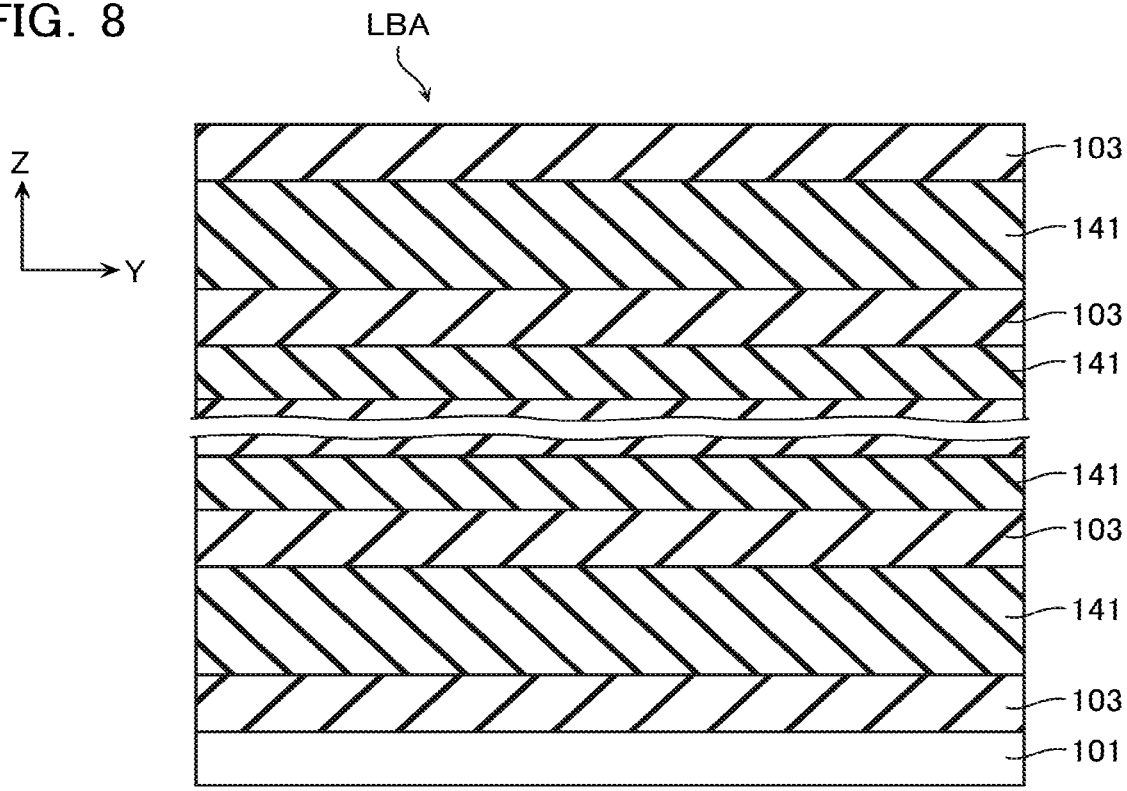
FIGS. 8 to 18 are cross-sectional views for explaining the same method of manufacturing.

As shown in FIGS. 7 and 8, in step S101, a stacked body LBA that includes a plurality of the inter-layer insulating layers 103 and sacrifice layers 141 (first layers) is formed on the substrate 101. The inter-layer insulating layer 103 is formed by depositing an insulating layer of the likes of silicon oxide ($SiO_2$), by a method such as CVD (Chemical Vapor Deposition), for example. The sacrifice layer 141 is formed by depositing the likes of silicon nitride ($Si_3N_4$) by a method such as CVD, for example.

Figure 9:
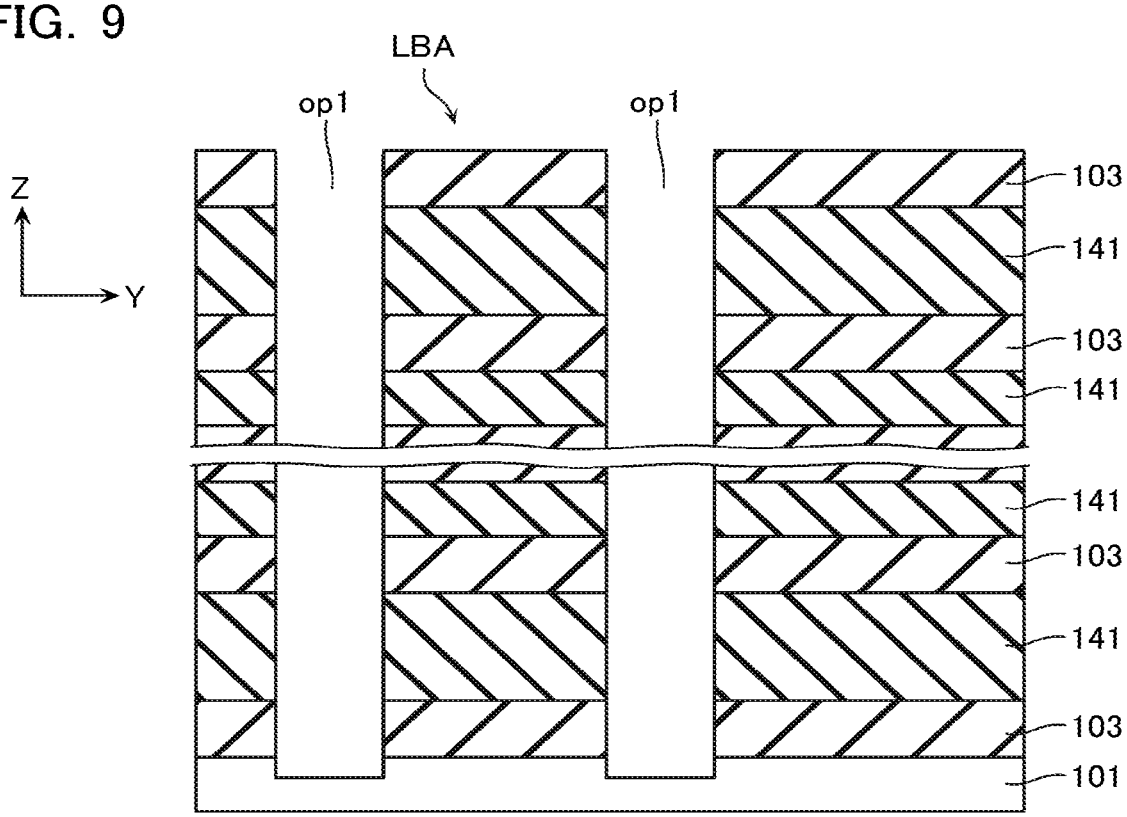

As shown in FIGS. 7 and 9, in step S102, an opening op1 (first opening) is formed in the stacked body LBA. The opening op1 is a through hole that extends in the Z direction and penetrates the plurality of inter-layer insulating layers 103 and sacrifice layers 141 stacked on the substrate 101 to expose an upper surface of the substrate 101. The opening op1 is formed by a means such as RIE (Reactive Ion Etching), for example.

Figure 10:
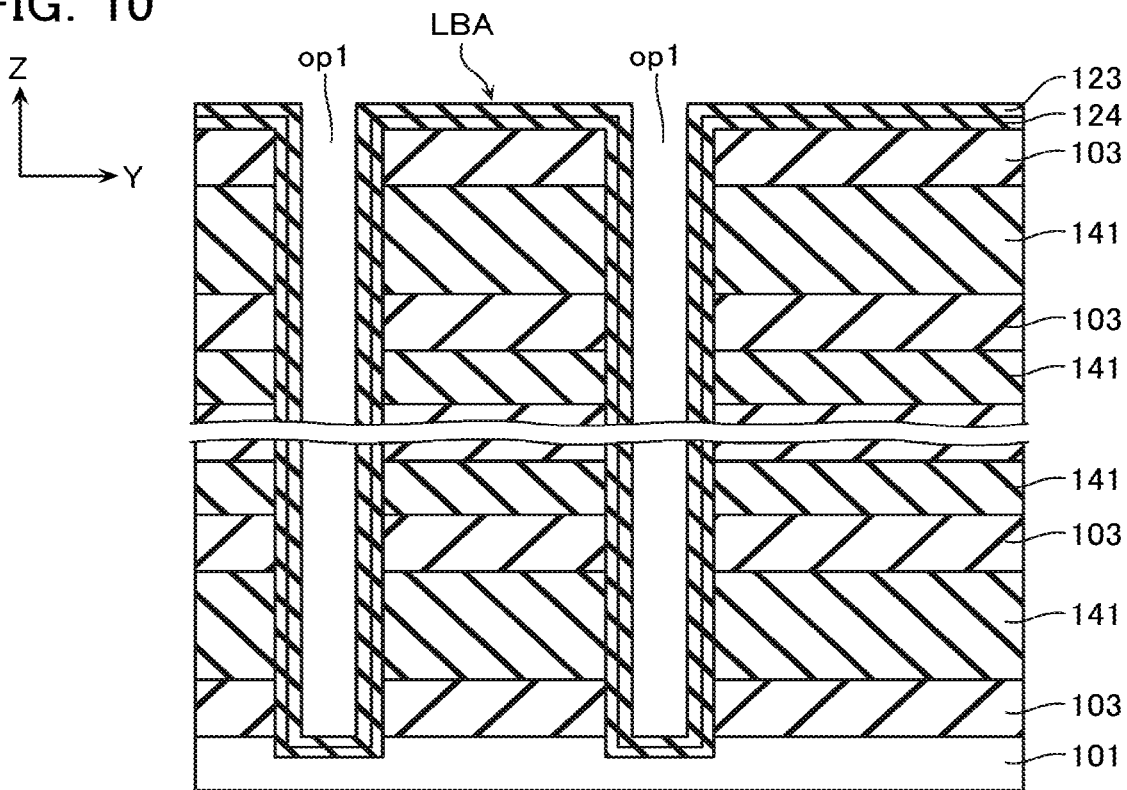
Figure 11:
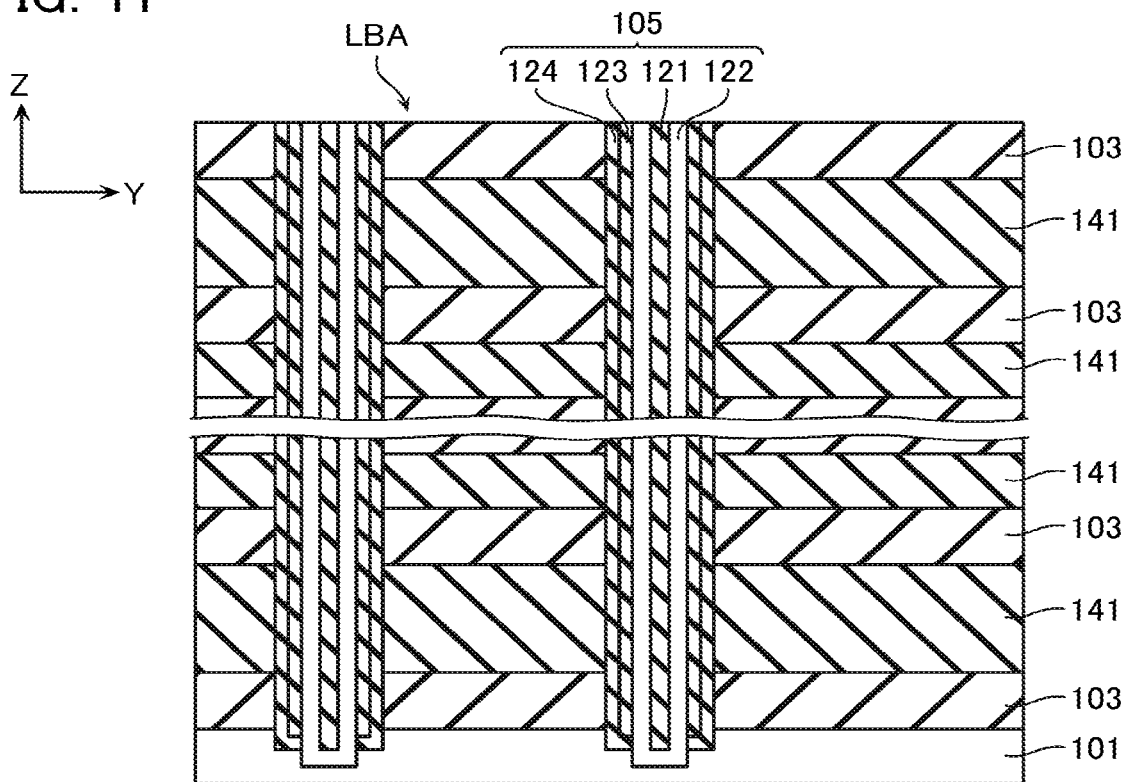

As shown in FIGS. 7, 10, and 11, in step S103, the memory columnar body 105 is formed inside the opening op1.

For example, as shown in FIG. 10, silicon nitride ($Si_3N_4$) or the like is formed as the charge accumulation layer 124 and silicon oxide ($SiO_2$) or the like is formed as the tunnel insulating layer 123, sequentially, on a bottom surface and side surface of the opening op1. Formation of these layers is performed by a method such as CVD, for example.

Moreover, as shown in FIG. 11, portions positioned at the bottom surface of the opening op1, of these charge accumulation layer 124 and tunnel insulating layer 123 are selectively removed. Removal of these layers is performed by a means such as RIE, for example.

Moreover, the semiconductor layer 122 and the core insulating layer 121 are formed inside the opening op1. For example, polysilicon or the like is formed on a side surface of the tunnel insulating layer 123, as the semiconductor layer 122. Formation of this polysilicon or the like is performed by a method such as CVD, for example. Moreover, silicon oxide ($SiO_2$) or the like is implanted as the core insulating layer 121.

Figure 12:
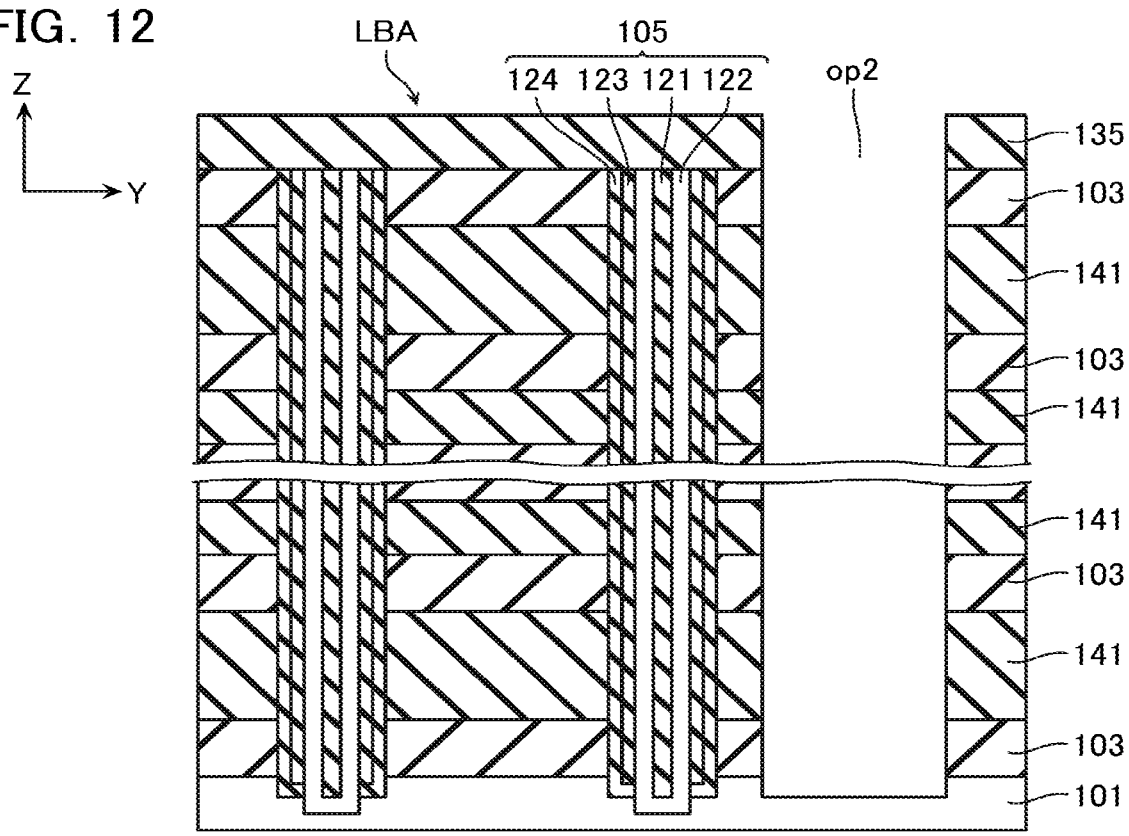

As shown in FIGS. 7 and 12, in step S104, a trench op2 (second opening) is formed. The trench op2 is, for example, a trench that extends in the Z direction and the X direction and penetrates the plurality of inter-layer insulating layers 103 and sacrifice layers 141 stacked on the substrate 101 to expose the upper surface of the substrate 101. The trench op2 is formed by, for example, forming the inter-layer insulating layer 135 on the stacked body LBA and performing RIE or the like using this inter-layer insulating layer 135 as a mask.

Figure 13:
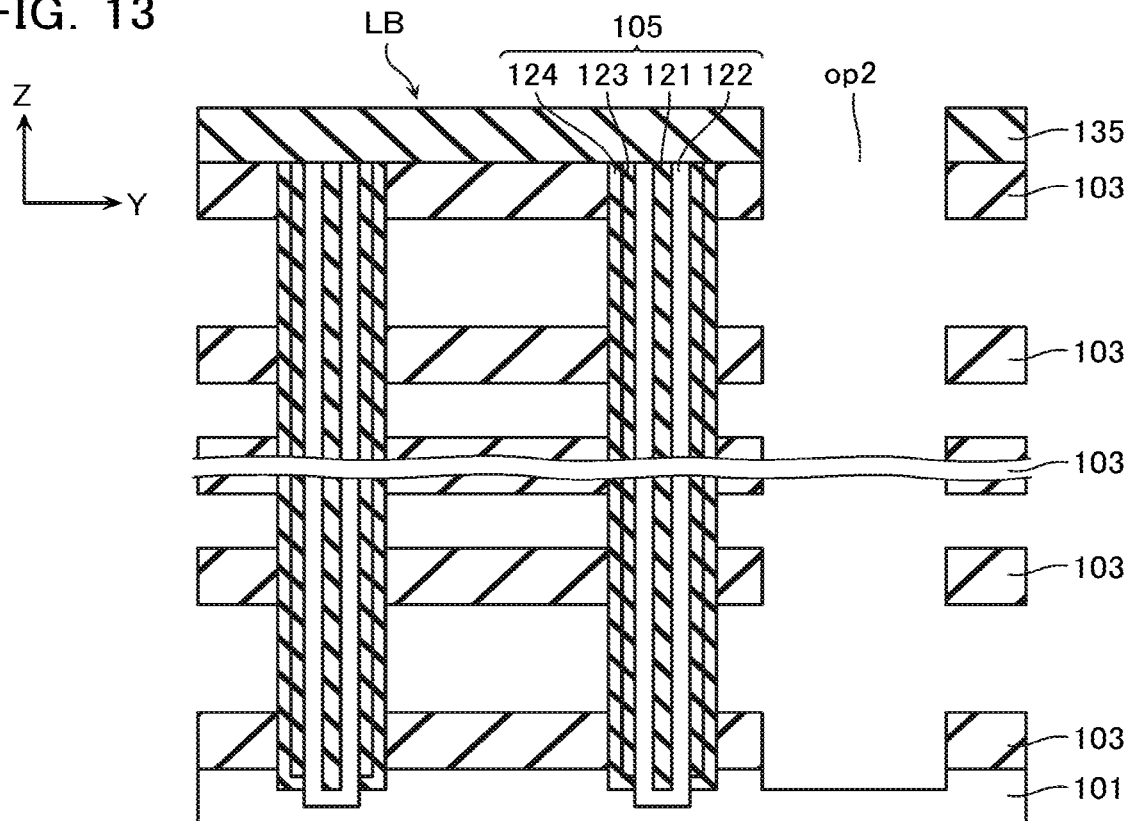
Figure 14:
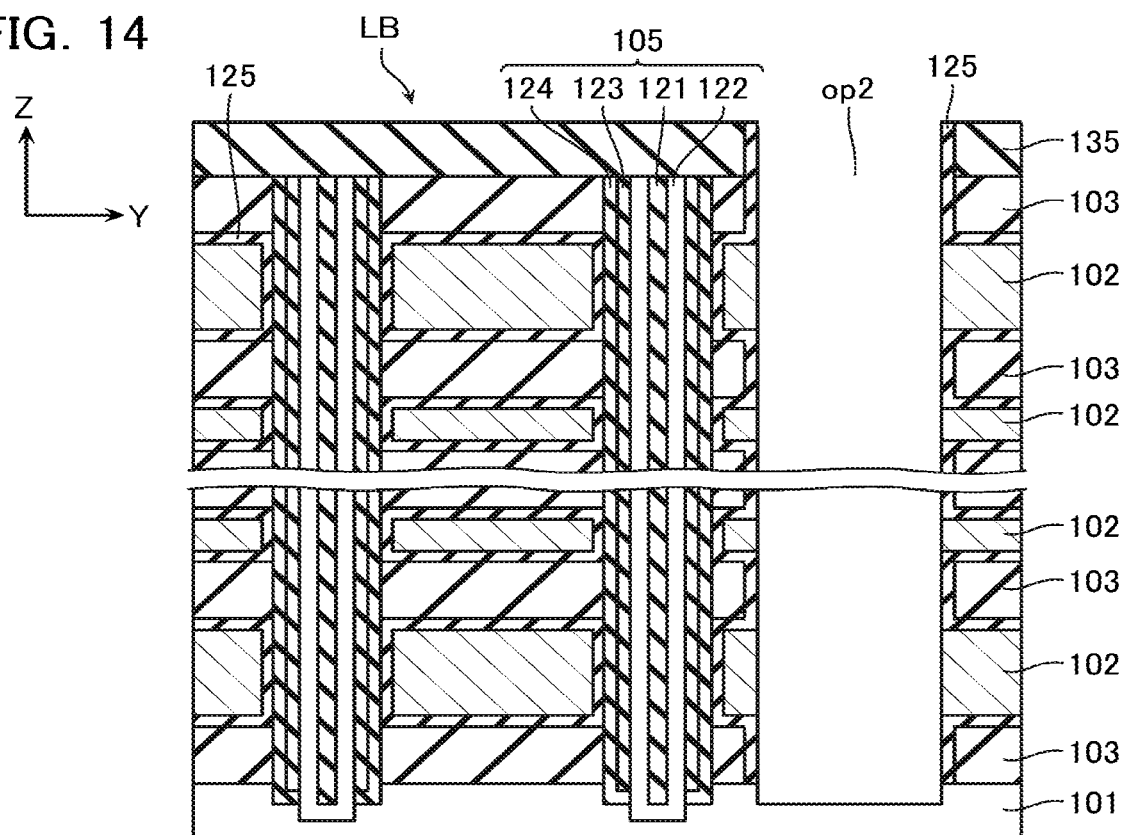

As shown in FIGS. 7, 13, and 14, in step S105, the conductive layer 102 functioning as the control gate of the memory cell MC, and so on, is formed.

For example, as shown in FIG. 13, the sacrifice layer 141 is removed via the trench op2. The sacrifice layer 141 is removed by the likes of wet etching using phosphoric acid, for example.

Moreover, as shown in FIG. 14, the block insulating layer 125 and the conductive layer 102 are formed on an upper surface, lower surface, and side surface of the inter-layer insulating layer 103, and a portion formed on the side surface of the inter-layer insulating layer 103, of the conductive layer 102 is selectively removed, via the trench op2. Note that this step may be performed such that the portion formed on the side surface of the inter-layer insulating layer 103, of the conductive layer 102 remains. The block insulating layer 125 is formed by depositing silicon oxide ($SiO_2$) or the like by a means such as CVD, for example. The conductive layer 102 is formed by depositing tungsten (W) or the like by a means such as CVD, for example.

Figure 15:
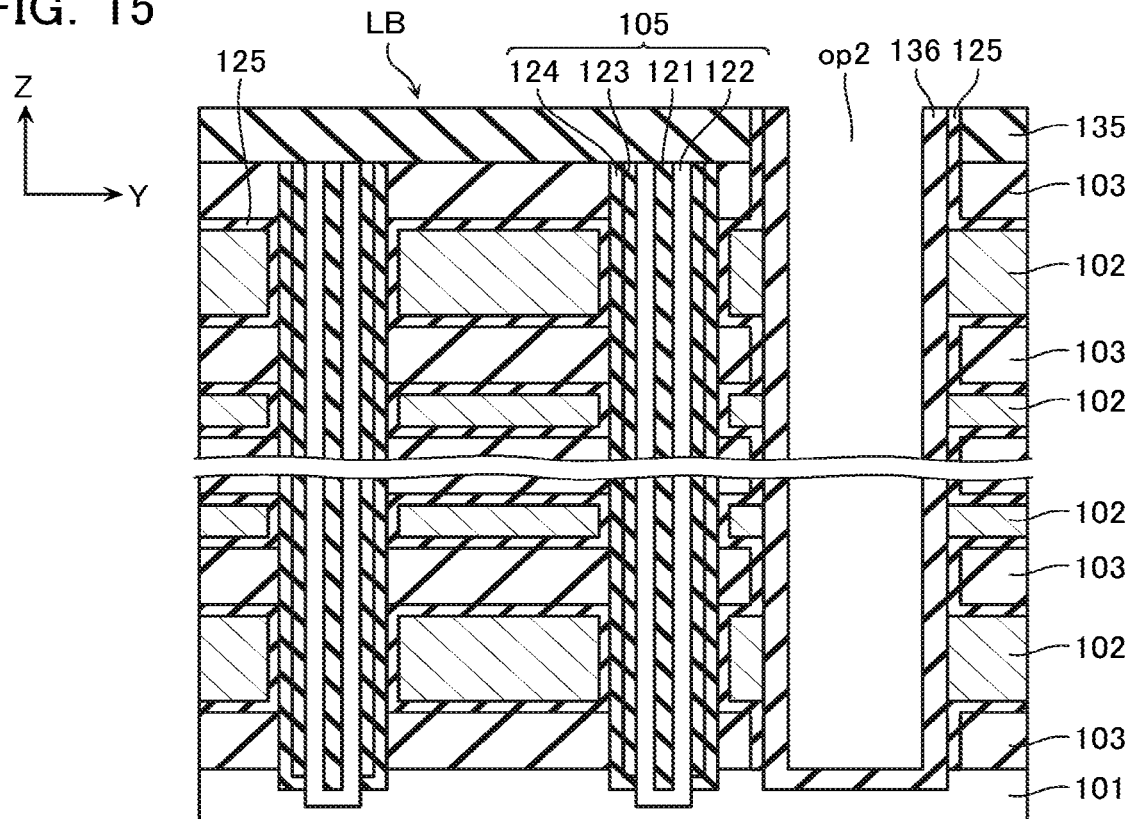

As shown in FIGS. 7 and 15, in step S106, the spacer insulating layer 136 is formed. The spacer insulating layer 136 is formed on a side surface and bottom surface of the trench op2, that is, on side surfaces of the conductive layer 102 and block insulating layer 125 and the upper surface of the substrate 101, for example. Moreover, the spacer insulating layer 136 is formed by depositing silicon oxide ($SiO_2$) or the like by a means such as CVD, for example. Note that in the present embodiment, the spacer insulating layer 136 is formed so as to cover side surfaces of the inter-layer insulating layers 103 and 135 via the block insulating layer 125.

Figure 16:
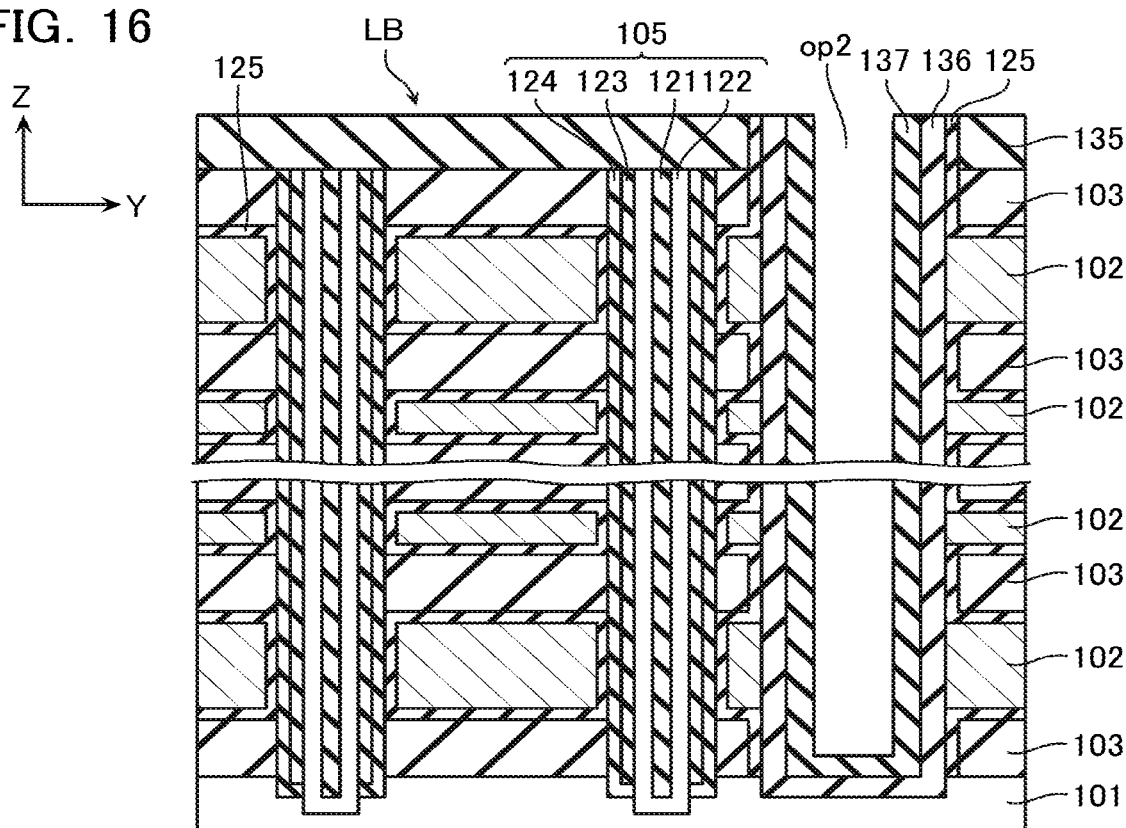

As shown in FIGS. 7 and 16, in step S107, the spacer protective layer 137 is formed. The spacer protective layer 137 is formed on the side surface and bottom surface of the trench op2, that is, on a side surface and upper surface of the spacer insulating layer 136. Moreover, the spacer protective layer 137 is, for example, formed from a material having a lower etching rate (a material having a higher etching resistance) than the spacer insulating layer 136. For example, when the spacer insulating layer 136 is formed from silicon oxide ($SiO_2$), the spacer protective layer 137 may be formed from the likes of silicon nitride ($Si_3N_4$) or alumina ($Al_2O_3$). Note that formation of the spacer protective layer 137 is performed by a means such as CVD, for example. Moreover, the spacer protective layer 137 may be formed such that, for example, the closer to the bottom surface of the trench op2 its position is, the thinner it becomes, and the further it is from the bottom surface of the trench op2, the thicker it becomes.

Figure 17:
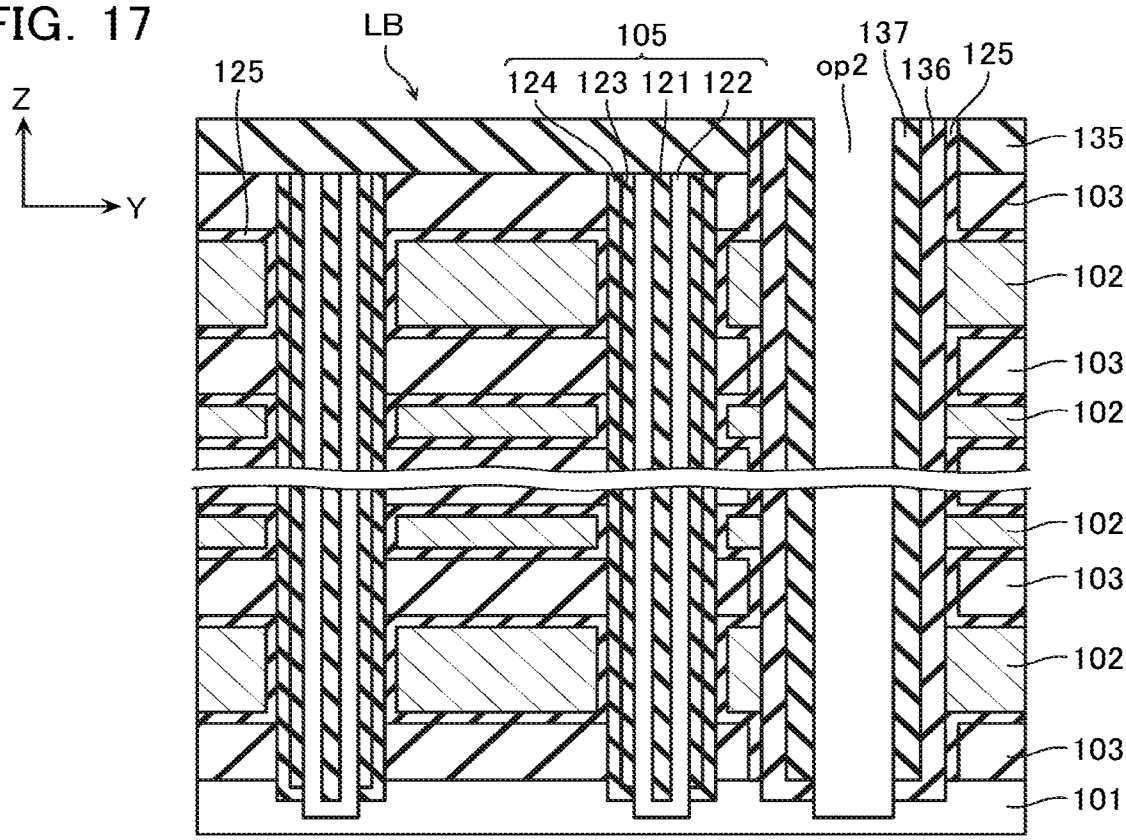

As shown in FIGS. 7 and 17, in step S108, processing of the spacer insulating layer 136 and spacer protective layer 137 is performed. That is, a portion covering the bottom surface of the trench op2, that is, the upper surface of the substrate 101, of the spacer insulating layer 136 and spacer protective layer 137, is selectively removed. By this step, the upper surface of the substrate 101 is exposed. Note that a portion covering the side surface of the trench op2, that is, a side surface of the stacked body LB, of the spacer insulating layer 136 and spacer protective layer 137, is left unremoved. Note that removal of the spacer insulating layer 136 and spacer protective layer 137 is performed by a means such as RIE, for example.

Figure 18:
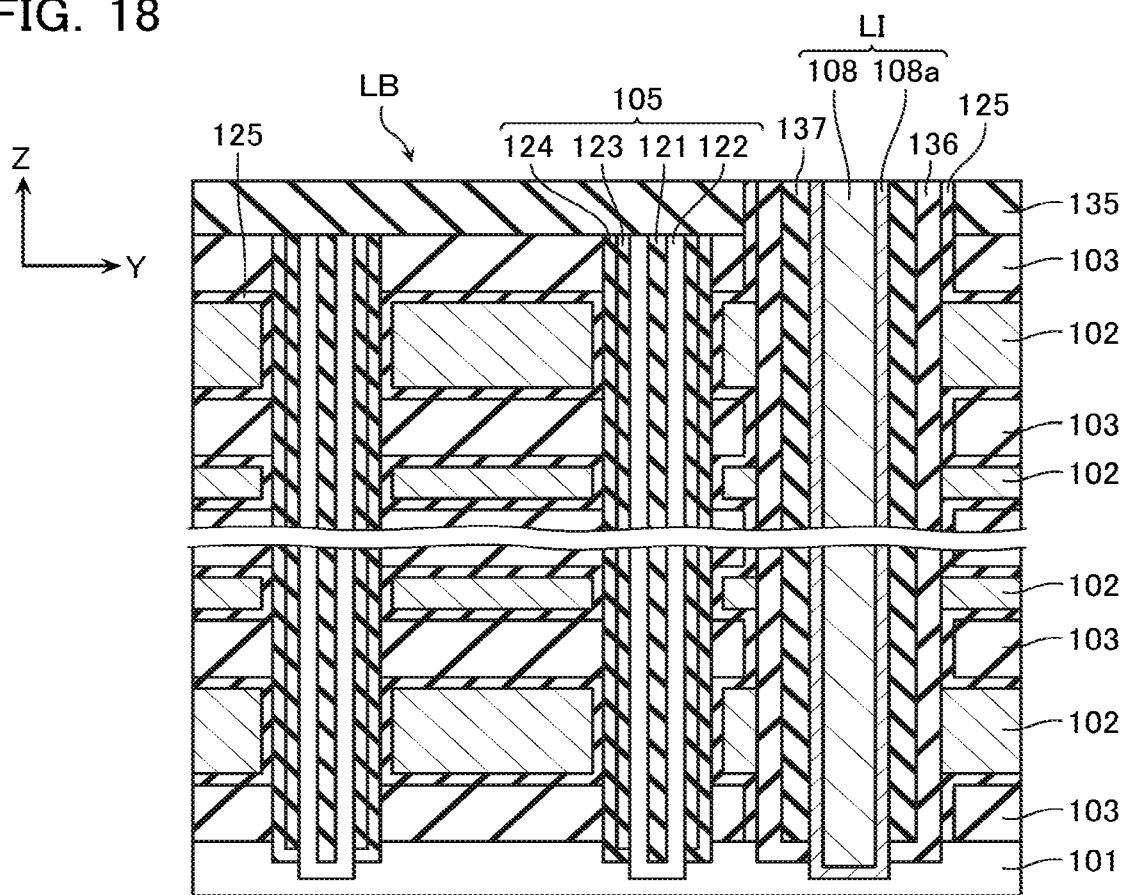

As shown in FIGS. 7 and 18, in step S109, the source contact LI (barrier metal layer 108a and conductive layer 108) is formed inside the trench op2. For example, the barrier metal layer 108a is formed on the side surface of the spacer protective layer 137 and the upper surface of the substrate 101, and the conductive layer 108 is formed on an upper surface and side surface of this barrier metal layer 108a. The barrier metal layer 108a is formed by depositing the likes of titanium (Ti) or titanium nitride (TiN) by a means such as CVD, for example. The conductive layer 108 is formed by depositing tungsten (W) or the like by a means such as CVD, for example.

Then, as shown in FIG. 5A, the conductive layer 138 functioning as the bit line contact BC is formed, whereby the semiconductor memory device shown in FIG. 5A is manufactured.

Figure 19:
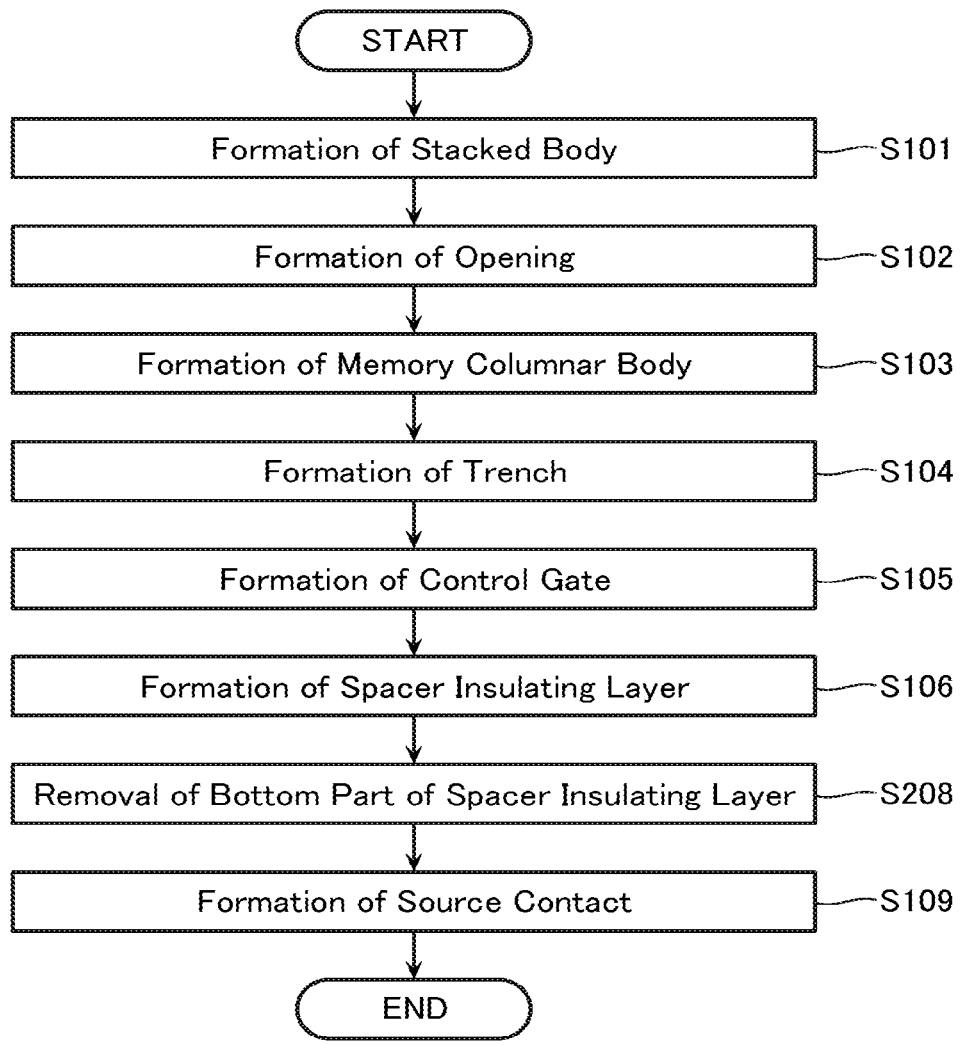
FIG. 19 is a flowchart for explaining a method of manufacturing the nonvolatile semiconductor memory device according to the comparative example.
Figure 20:
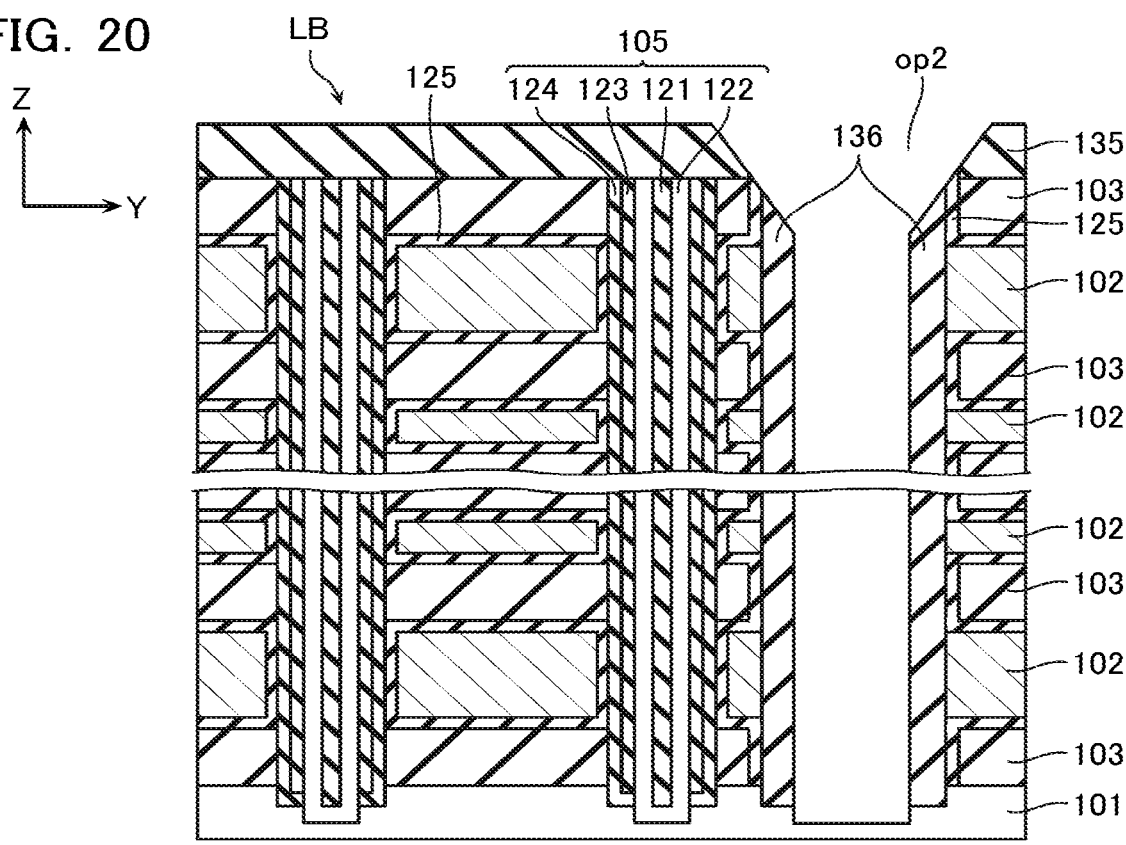
FIG. 20 is a cross-sectional view for explaining the same method of manufacturing.

Now, when, for example, it is attempted to perform processing of the spacer insulating layer 136 without forming a spacer protective layer as shown in FIG. 19, sometimes, as shown in FIG. 20, a width in an upper end vicinity of the trench op2 ends up broadening. Therefore, in such a case, when a conductive layer 208 functioning as the source contact LI is formed inside the trench op2, then sometimes, as described with reference to FIG. 6, for example, the width at the upper surface of the source contact LI ends up broadening, and there ends up being contact with the conductive layer 138 functioning as the bit line contact BC.

In contrast, in the present embodiment, as described with reference to FIGS. 7 and 16, the spacer protective layer 137 is formed in step S107. As a result, in the processing of the spacer insulating layer 136 described with reference to FIG. 17 (step S108), it is possible to suppress that the width in the upper end vicinity of the trench op2 broadens. This makes it possible to suppress broadening of the width of the upper surface of the source contact LI and suppress contact between the source contact LI and the bit line contact BC.

Moreover, in the present embodiment, as described with reference to FIGS. 7 and 18, in step S109, the barrier metal layer 108a is formed on the side surface of the spacer protective layer 137, and the conductive layer 108 is formed on the side surface of this barrier metal layer 108a. Therefore, in the present embodiment, a layer other than the barrier metal layer 108a is not provided between the conductive layer 108 and the spacer protective layer 137, hence the width of the upper surface of the source contact LI can be kept to a minimum.

Moreover, in the present embodiment, as described with reference to FIGS. 7 and 14, after the block insulating layer 125 and the conductive layer 102 have been formed on the side surfaces of the inter-layer insulating layers 103 and 135, a portion formed on the side surface of the inter-layer insulating layer 103, of the conductive layer 102 is selectively removed. Here, this step is performed such that a portion formed on the side surface of the inter-layer insulating layer 135, of the block insulating layer 125 remains. Moreover, as described with reference to FIGS. 7 and 15, the spacer insulating layer 136 is formed so as to cover the side surfaces of the inter-layer insulating layers 103 and 135 via the block insulating layer 125. As a result, in the processing of the spacer insulating layer 136 described with reference to FIG. 17 (step S108), even when parts of the spacer protective layer 137 and spacer insulating layer 136 end up getting removed, it is possible to suppress that part of the inter-layer insulating layer 135 gets removed, and it is possible to more certainly suppress contact between the source contact LI and the bit line contact BC.

Second Embodiment

Figure 21:
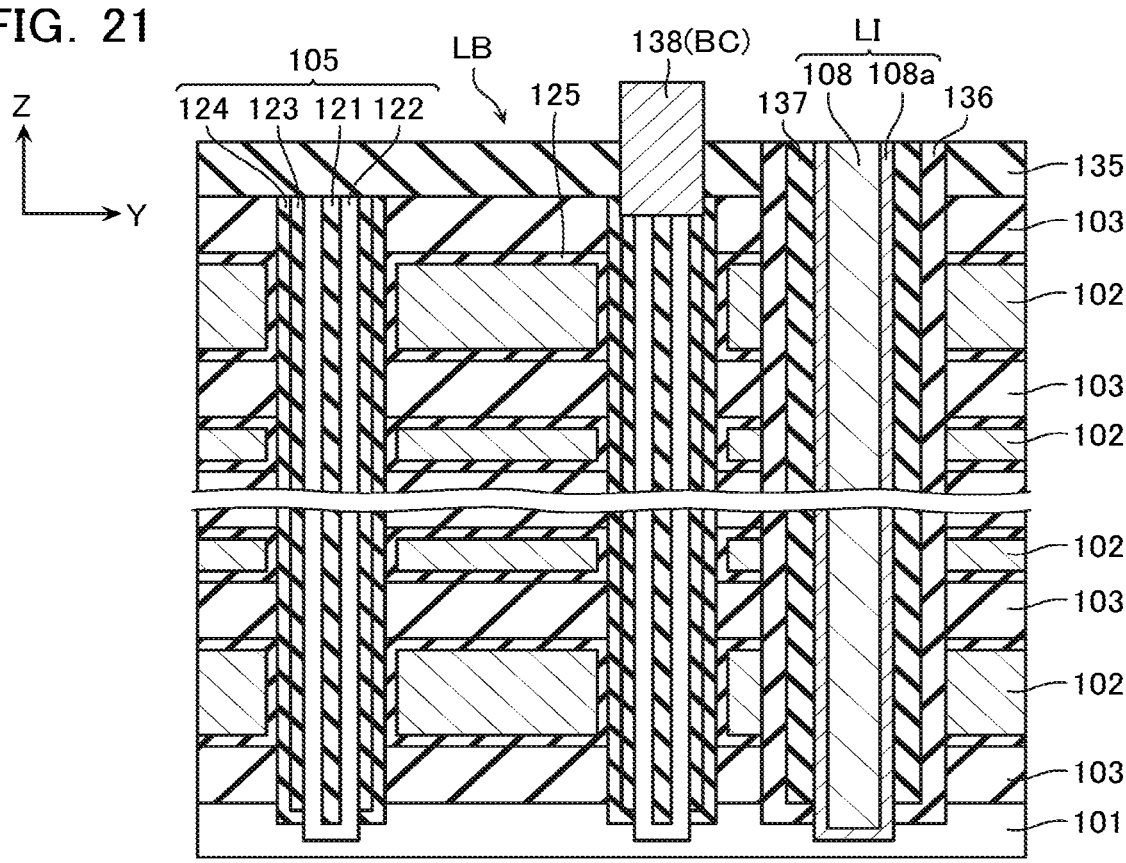
FIG. 21 is a cross-sectional view showing a configuration of part of a nonvolatile semiconductor memory device according to a second embodiment.

FIG. 21 is a cross-sectional view showing a configuration of a nonvolatile semiconductor memory device according to a second embodiment. Note that in the description below, portions similar to those of the first embodiment will be assigned with identical reference symbols to those assigned in the first embodiment, and descriptions thereof will be omitted.

As described with reference to FIG. 5A, in the first embodiment, the block insulating layer 125 is provided between the spacer insulating layer 136 and the inter-layer insulating layer 103. Now, when, for example, the block insulating layer 125 is formed from a material having a lower insulation rate (a higher conductivity) than the inter-layer insulating layer 103, there is a possibility that a leak current ends up occurring between the conductive layers 102 adjacent in the Z direction, via this block insulating layer 125.

Accordingly, as shown in FIG. 21, in the present embodiment, the block insulating layer 125 is not provided between the spacer insulating layer 136 and the inter-layer insulating layer 103, whereby the block insulating layer 125 is divided in the Z direction (first direction). This makes it possible to reduce the possibility that a leak current ends up occurring between the conductive layers 102 adjacent in the Z direction. Note that in other respects, the nonvolatile semiconductor memory device according to the present embodiment is configured similarly to the nonvolatile semiconductor memory device according to the first embodiment.

Note that the nonvolatile semiconductor memory device according to the present embodiment can be manufactured basically similarly to the nonvolatile semiconductor memory device according to the first embodiment. However, in the present embodiment, in step S105 described with reference to FIGS. 7 and 14, a portion formed on the side surface of the inter-layer insulating layer 103, of the conductive layer 102 and block insulating layer 125 is selectively removed.

OTHER EMBODIMENTS

As described with reference to FIG. 3, the lower end of the memory columnar body 105 according to the first embodiment is connected to the conductive layer 108 functioning as the source contact LI, via the substrate 101. However, the lower end of the memory columnar body 105 may be connected to the conductive layer 108 via a configuration other than the substrate 101.

Figure 22:
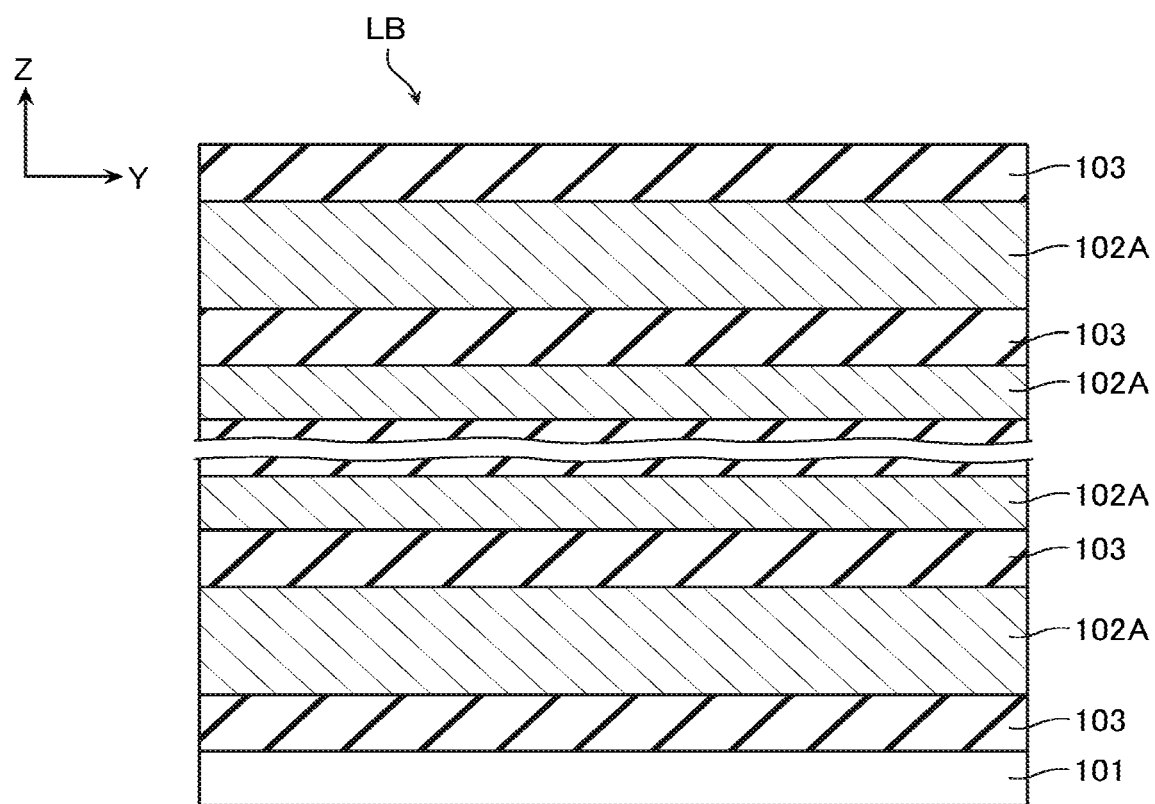
FIG. 22 is a cross-sectional view for explaining another method of manufacturing a nonvolatile semiconductor memory device according to an embodiment.

Moreover, as described with reference to FIG. 8, in manufacturing steps according to the first embodiment, the stacked body LBA including the plurality of inter-layer insulating layers 103 and sacrifice layers 141 (first layers) is formed on the substrate 101. However, as shown in FIG. 22, a conductive layer 102A forming the conductive layer 102, of the likes of polysilicon or tungsten, may be directly formed as the first layer, instead of the sacrifice layer 141. In this case, the conductive layers 102 can be formed by forming the trench op2 to divide the first layers (the conductive layers 102A).

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a plurality of control gate electrodes stacked in a first direction crossing a substrate;
a first semiconductor layer extending in the first direction;
a charge accumulation layer disposed between the control gate electrode and the first semiconductor layer;
a contact extending in the first direction along the plurality of control gate electrodes;
a first spacer insulating layer disposed between the plurality of control gate electrodes and the contact and including a first material; and
a second spacer insulating layer disposed between the contact and the first spacer insulating layer and including a second material different from the first material,
the contact including:
a first portion having a first width in a second direction perpendicular to the first direction;
a second portion having a second width in the second direction; and
an uppermost portion having a third width in the second direction,
the first portion being between the uppermost portion and the second portion,
the third width being larger than the first width,
the first width being the same as the second width.
2. The semiconductor memory device according to claim 1, wherein
the contact comprises:
a first conductive layer extending in the first direction; and
a barrier metal layer provided between the first conductive layer and the second spacer insulating layer.
3. The semiconductor memory device according to claim 1,
the first spacer insulating layer and the second spacer insulating layer including silicon (Si).
4. The semiconductor memory device according to claim 1 further comprising a tunnel insulating layer disposed between the first semiconductor layer and the control gate electrode.
5. The semiconductor memory device according to claim 4 further comprising a block insulating layer disposed between the charge accumulation layer and the control gate electrode.
6. The semiconductor memory device according to claim 5 further comprising:
first inter-layer insulating layers disposed between the control gate electrodes; and
a second inter-layer insulating layer provided above the control gate electrodes and the first inter-layer insulating layers, wherein
the block insulating layer is provided between the second inter-layer insulating layer and the contact.
7. The semiconductor memory device according to claim 5, wherein
the block insulating layer is divided in the first direction.
8. The semiconductor memory device according to claim 1 comprising:
a second semiconductor layer nearer to the substrate than the plurality of the control gate electrodes.
9. The semiconductor memory device according to claim 8, wherein
the contact being connected to the second semiconductor layer.
10. The semiconductor memory device according to claim 1, wherein
the contact being connected to the substrate.
11. The semiconductor memory device according to claim 10, wherein the contact extending in a third direction perpendicular to the first direction and the second direction, the first spacer insulating layer extending in the first direction and the third direction, and the second spacer insulating layer extending in the first direction and the third direction.

12. The semiconductor memory device according to claim 1, wherein the uppermost portion of the contact being directly contacted to the first spacer insulating layer.

13. The semiconductor memory device according to claim 12, wherein the first portion and the second portion of the contact being separated from the first spacer insulating layer via the second spacer insulating layer.

14. A semiconductor memory device comprising:

a substrate;

a plurality of control gate electrodes stacked in a first direction crossing the substrate;

a first semiconductor layer extending in the first direction;

a charge accumulation layer disposed between the control gate electrode and the first semiconductor layer;

a contact extending in the first direction along the plurality of control gate electrodes;

a first spacer insulating layer disposed between the plurality of control gate electrodes and the contact and including a first material; and a second spacer insulating layer disposed between the contact and the first spacer insulating layer and including a second material different from the first material, the second spacer insulating layer including:

a first portion disposed between the contact and the plurality of control gate electrodes; and a second portion further from the substrate than the plurality of control gate electrodes, the second portion including an end in the first direction of the second spacer insulating layer, and a width of the second portion in a second direction perpendicular to the first direction decreasing towards the end in the first direction of the second spacer insulating layer.

15. The semiconductor memory device according to claim 14, wherein the contact comprises:

a first conductive layer extending in the first direction; and a barrier metal layer provided between the first conductive layer and the second spacer insulating layer.

16. The semiconductor memory device according to claim 14, the first spacer insulating layer and the second spacer insulating layer including silicon (Si).

17. The semiconductor memory device according to claim 14 further comprising a tunnel insulating layer disposed between the first semiconductor layer and the control gate electrode.

18. The semiconductor memory device according to claim 17 further comprising a block insulating layer disposed between the charge accumulation layer and the control gate electrode.

19. The semiconductor memory device according to claim 18 further comprising:

first inter-layer insulating layers disposed between the control gate electrodes; and a second inter-layer insulating layer provided above the control gate electrodes and the first inter-layer insulating layers, wherein the block insulating layer is provided between the second inter-layer insulating layer and the contact.

20. The semiconductor memory device according to claim 18, wherein the block insulating layer is divided in the first direction.

21. The semiconductor memory device according to claim 14 comprising:

a second semiconductor layer nearer to the substrate than the plurality of the control gate electrodes.

22. The semiconductor memory device according to claim 21, wherein the contact being connected to the second semiconductor layer.

23. The semiconductor memory device according to claim 14, wherein the contact being connected to the substrate.

24. The semiconductor memory device according to claim 23, wherein the contact extending in a third direction perpendicular to the first direction and the second direction, the first spacer insulating layer extending in the first direction and the third direction, and the second spacer insulating layer extending in the first direction and the third direction.

25. The semiconductor memory device according to claim 14, wherein the contact including:

a first portion extending in the first direction; and a second portion being further from the substrate than the plurality of control gate electrodes, the first portion being separated from the first spacer insulating layer via the second spacer insulating layer, and the second portion being directly contacted to the first spacer insulating layer.

* * * * *